(12) United States Patent
Rahn et al.

(10) Patent No.: US 7,187,913 B1
(45) Date of Patent: Mar. 6, 2007

(54) INTEGRATED CIRCUIT TUNER WITH BROAD TUNING RANGE

(75) Inventors: David Rahn, Kanata (CA); Stefan Fulga, Great Dunmow (GB)

(73) Assignee: SiGe Semiconductor Inc., Ottawa (CA)

( * ) Notice: Subject to any disclaimer, the term of this patent is extended or adjusted under 35 U.S.C. 154(b) by 726 days.

(21) Appl. No.: 10/349,931

(22) Filed: Jan. 24, 2003

Related U.S. Application Data

(60) Provisional application No. 60/351,011, filed on Jan. 25, 2002.

(51) Int. Cl.
*H04B 1/18* (2006.01)

(52) U.S. Cl. .............................. 455/188.1; 455/179.1; 455/307; 455/333; 348/731

(58) Field of Classification Search ............. 455/188.1, 455/188.2, 191.1, 192.1, 192.2, 227, 266, 455/179.1, 182.3, 307, 333, 339, 197.2; 348/725, 348/731
See application file for complete search history.

(56) References Cited

U.S. PATENT DOCUMENTS

| | | | |
|---|---|---|---|
| 5,483,209 A * | 1/1996 | Takayama | 455/266 |
| 5,752,179 A * | 5/1998 | Dobrovolny | 455/266 |
| 6,177,964 B1 | 1/2001 | Birleson et al. | |
| 6,281,946 B1 * | 8/2001 | Hisada et al. | 348/725 |
| 6,472,957 B1 | 10/2002 | Dobrovolny | |
| 6,535,722 B1 * | 3/2003 | Rosen et al. | 348/731 |
| 2003/0050026 A1 * | 3/2003 | Connell et al. | 455/266 |

* cited by examiner

*Primary Examiner*—Quochien B. Vuong
(74) *Attorney, Agent, or Firm*—Kenyon & Kenyon LLP

(57) ABSTRACT

An integrated front end filter for a tuner provides an array of from several to a multitude of passbands, each for passing at least one but less than all channels designated in a band of frequencies. Each passband is exclusively selectable. The integrated front end filter can include at least one active filter unit with an active reactance element in either of fixed and variable filter configurations and a decoder coupled to said at least one active filter unit and being responsive to a control signal for selecting a one of the passbands. In one example, a multitude of active filter units of fixed filter configuration provide the multitude of passbands. In another example, a plurality of data corresponds to a like plurality of selectable passbands in combination with a filter element of the variable filter configuration. Each data is stored at a predetermined location and reproduced in response to a corresponding control data signal from a tuner controller. Each data characterizes one of the plurality of passbands. The filter element is switchable from one passband to another in response to the control data signal. Lower power dissipation and lesser requirements of an on-following integrated circuitry tuner permit a reduction of "off chip" connections and cost.

30 Claims, 14 Drawing Sheets

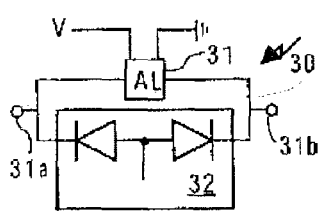
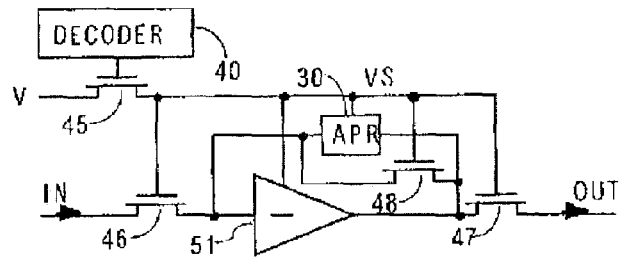
Fig. 9
Fig. 10
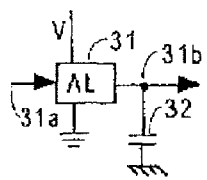
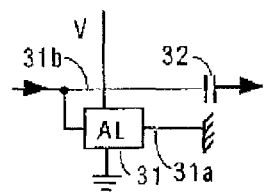
Fig. 11a
Fig. 11b
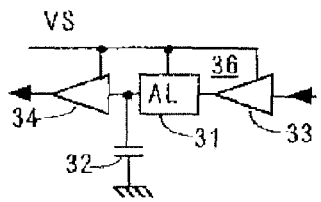
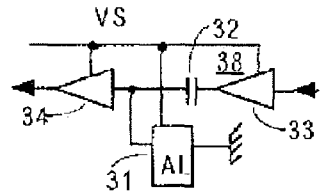
Fig. 11c
Fig. 11d
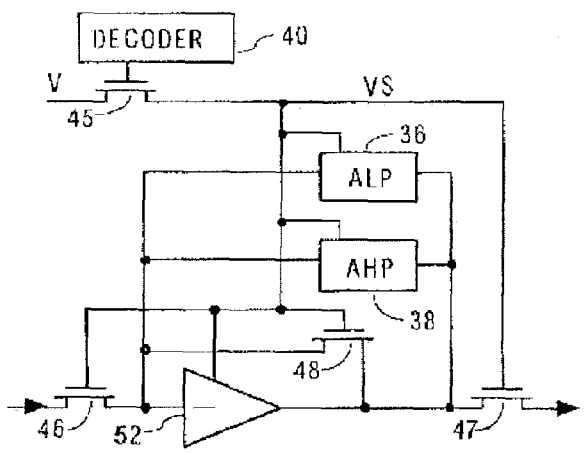
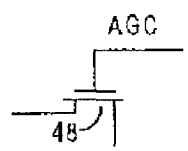
Fig. 12b
Fig. 12a

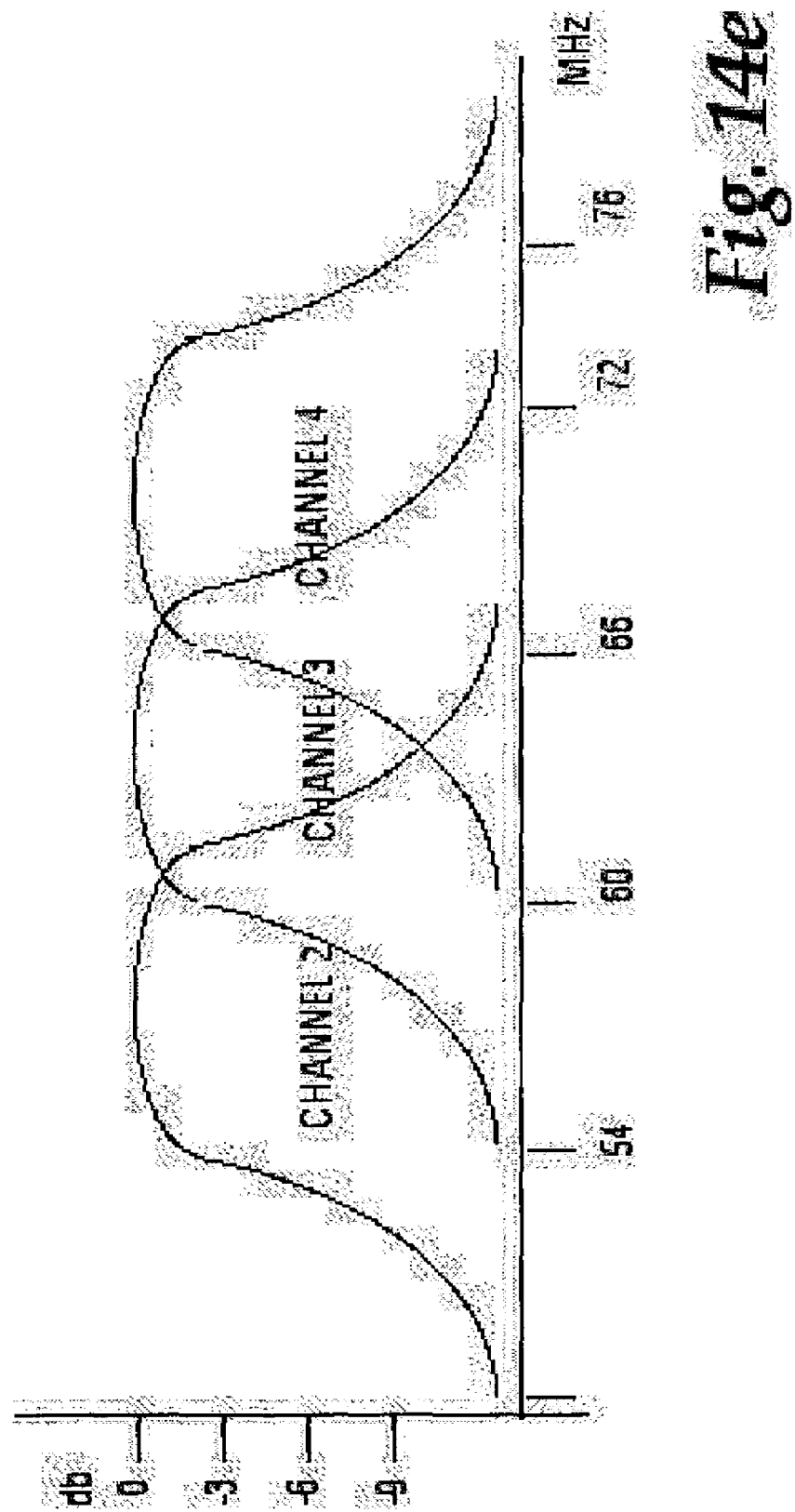

INTEGRATED CIRCUIT TUNER WITH BROAD TUNING RANGE

This application claims the benefit of U.S. Provisional Application No. 60/351,011 filed Jan. 25, 2002.

FIELD OF THE INVENTION

The invention relates to tuners for receiving radio frequency signals, particularly tuners being operable over a broad range of frequencies including, but not limited to, frequencies typically used for distribution of television signals. More particularly the invention is in the field of tuners circuits that are fabricated in the form of an integrated circuit device that function over a broad tuning range.

BACKGROUND OF THE INVENTION

A receiver of radio frequency signals, for example a radio receiver or a television (TV) set, is usually characterized by two primary components. One being that of a tuner for selecting a frequency or band of frequencies intended for reception and the second being for processing the selected signals whereby information is presented to a user in an intended format. Some formats are radio telemetry, radio-telephone and broadcast radio programming, the later two usually being audibly reproduced. Another format is that of television and television programming. Television is characterized by a visible presentation of visual information signals. In television programming the visible presentation is usually accompanied by an audible reproduction of audio information. Over the years tuners have been provided which operate by various different methods for selecting a frequency band, or channel, for reception. Some examples of methods of operation include, tuned radio frequency, super regenerative, and superheterodyne.

A radio receiver operating by the tuned radio frequency method includes a series of variable bandpass filters and amplifiers. The filters are tuned in tandem to amplify a desired signal frequency band more than other signal frequencies. In the early days of vacuum tube radios the tuned radio frequency method provided unsurpassed fidelity of audio loudspeaker reproduction and it was the preferred method of selecting a radio program signal. However, such tuners generally had limited sensitivity and selectivity and were comparatively expensive. Presently loudspeaker radio receivers operated by the tuned radio frequency method are rare and might be considered to be collectibles.

A radio receiver operating by the super regenerative method uses feedback and includes fewer devices. It could provide very sensitive and selective reception but reproduction of the audio signal could include annoying noises such as hissing and whistling, induced by the tuner's operation. Its operation often required some skill on the part of the user to get satisfactory reception and reproduction of the radio program. Consequently, in spite of its lesser expense, it was never really found to be favourable. Presently, radio receivers operating by the super regenerative method are very rare.

Receivers that operate using the superheterodyne method are commonplace. A superheterodyne receiver converts a desired signal to an intermediate frequency (IF) for filtering using a fixed bandpass filter. Signals having been passed through the fixed bandpass filter are processed by a second primary component of the receiver. A fixed bandpass filter is preferred because the filter characteristics are more readily and precisely determined and hence the desired signal is more readily distinguished from noise and other unwanted signals. Surface acoustic wave (SAW) filters are exemplary of the state of the art fixed bandpass filters.

More specifically, the tuner operates by mixing received signals with a locally generated oscillator signal to generate sum and difference signals. The user adjusts the local oscillator so that a predetermined one of either the sum or the difference signals are within the passband of the filter. This process is referred to as frequency conversion, where a signal of the desired frequency of reception is converted to the IF signal. IF signals passed by the filter are either directly supplied to the second primary component of the receiver, or a first converted to base band and then supplied to the second primary component of the receiver. If the receiver is required to provide superior selectivity, then more than one intermediate frequency, corresponding mixers, and IF filters are used. Also, improved sensitivity is obtained if a low noise amplifier and a filter are used to amplify received signals with emphasis on signals in a band of interest before the signals are converted by the mixer to the IF signals. In a receiver intended to receive commercial television signals the band of interest lies between about 50 MHz and more than 800 MHz.

The tuner element in any radio receiver, or TV set, is critical to the satisfactory quality of presentation of received program information. The tuner must accept the full bandwidth of a desired signal frequency to the substantial exclusion of any other signals. The tuner must operate in a linear fashion over a wide range of signal strengths. The tuner must not generate any significant noise, phase distortion or image frequency signals which would be deleterious to the eventual presentation of the program information to the user. The typical manufacturing cost of a quality TV tuner in relation to the manufacturing cost of an entire TV set is very substantial in spite of ongoing evolution of tuner design.

At one time, the standard TV set was limited to receiving only 12 channels within the very high frequency (VHF) spectrum, five channels (2–6) in a lower band and seven channels (7–13) in an upper band. A television tuner typically included an amplifier, an oscillator and a mixer, which were selectively coupled with one of 12 units, each having an input filter and a corresponding oscillator tank circuit. Each unit was dedicated for use in receiving a predetermined one of the 12 channels. Each unit was carried on an elongated insulating substrate and arranged in combination upon a rotatable framework to form a turret like cylinder. This so called "turret tuner" was rotated by the user to any of the 12 positions to effect connection, via gold plated electrical contacts, of the appropriate unit with the oscillator amplifier and the mixer to receive the desired TV channel. After manufacture, each unit required manual adjustment in order to be optimized for receiving the predetermined channel and included at least a variable inductor for this purpose. A fine-tuning control for user adjustment was required for each unit so that acceptable reception of a selected TV program would be available.

The TV turret portion in TV tuners was almost always a separate or modular element. This was convenient for manufacture and facilitated easy replacement by a service technician, when the plated contacts became worn. However, the amplifier, oscillator, mixer, as well as the fixed bandpass filter, often referred to as an IF strip, were more or less integral with the TV set.

Broadcast television tuners for TV sets have gone through a design evolution over a period of more than 60 years. The earliest tuners utilized vacuum tube technology and required that a minimum number of vacuum tubes be used due to their cost, power consumption, heat generation, and bulk.

Therefore, passive components, such as resistors, capacitors, inductors and transformers, were used as much as possible in most designs. This style of design using vacuum tubes continued until about 1960. Thereafter TV tuner components, particularly vacuum tubes, began to be replaced by transistors. In the early 1970's many functions of the tuner utilizing only one tube or transistor were replaced with 4 to 20 individual transistors, which in combination could perform the same function with better precision, less space, less power, less heat generation and lower cost. Bipolar transistors were popular until sufficiently stable metal oxide silicon field effect transistors (MOSFETs) became available in the late 1970s. However, the active device count still defines the cost and size limits of TV tuners and active device count minimization is continued.

The introduction of the integrated circuit was gradual, firstly limited to only lower frequency functions and eventually, as the integrated circuit MOSFET based technology evolved, use for higher frequency functions became practical. Nonetheless, many comparatively expensive passive discrete elements remained in TV tuner designs. In contrast to historical tuner designs, where passive elements were of lower cost, presently the cost of accommodating a few non-integrated off-chip passive elements, in combination with an integrated circuit in a TV tuner, has become a significant part of the cost of the tuner.

Recently available consumer electronic based devices, other than TV sets, may also be equipped with a TV tuner. For example within the last 20 years, video cassette recorders (VCRs) have been provided with an air and cable ready tuner. TV tuners are now typically modular in nature, that is not a built-in part of a TV set, or VCR, but an entirely modular, or separately plugged-in, element. A modular tuner may be arranged to provide an output signal at the customary 43 MHz intermediate frequency, or in any of several baseband signal formats, including separate audio and video outputs. This facilitates easy replacement if the tuner should fail as for example may occur in an event of a nearby lightening strike. When a tuner is used in a typical TV set with a cathode ray tube (CRT) display, the tuner size is not critical because the television set has an inherently large size, but when a tuner is used in other electronic equipment, or in association with a flat screen display device, space is at a greater premium. TV tuners are now being used in smaller and smaller computers, television sets, and VCRs. In recent years, some TV tuners have been reduced in size to modular units that are as small as about ½"×2"×⅜". As the equipment in which tuners are utilized becomes smaller, it is preferred that the bulk of the TV tuner must also at least decrease proportionately. In one example the modular TV tuner is manufactured to predetermined electronic and physical specifications for plug-in installation into a personal computer (PC) system or a laptop PC. This allows the PC to have the additional function of a TV set, however at the present time a retail price of such a modular tuner can be as much as a third or more of the retail price of the PC itself.

A presently manufactured TV tuner typically comprises one or two integrated circuits and numerous discrete elements being inductors, capacitors and transistors. IF to baseband conversion typically includes another integrated circuit, several filter elements, tuning and control elements, such as resistors and potentiometers, variable inductors and capacitors, and may require some other ancillary external components. There may be more than 100 elements on a presently manufactured tuner circuit board. Some of these elements are of course directly connected with one of the integrated circuit elements, where each such connection adds substantially to the cost of the integrated circuit tuner. Furthermore, state-of-the-art TV tuners usually require that each tuner be manually adjusted before leaving the factory. Comparative to the manufacturing cost of a TV set or VCR, the cost of the modular TV tuner portion thereof remains significant.

One advance in filter technology, the surface acoustic wave (SAW) filter, brought a significant change in that some discrete filter components such as capacitors and manually tuned inductors can be avoided or at least reduced in number. Filtering performance is improved and the resulting tuner design requires less space and is somewhat less costly. However, the SAW filter, which is fabricated on a ceramic substrate, is an off-chip device. It is also a rather low impedance device. Its low impedance matching, as well as drive requirements, results in complications such as significant power consumption. Furthermore broadband circuits tend to consume more power as compared to narrower band circuits. Consequently, as the upper frequency for receivable TV signals increases the power consumption of broadband amplifiers increases, particularly when used in combination with a SAW filter or filters. Heat dissipation and heat concentration in the already reduced surface area of a small TV tuner, adds heat stress to the circuit components therein as well as to nearby elements of the electronic apparatus. The consequent heat stress thus unfavorably affects the functional reliability of both the tuner and any nearby elements.

A need therefore exists to provide an integrated tuner circuit that requires less space, and is somewhat less costly than existing tuners, while offering improved performance and reduced power consumption over prior art designs.

SUMMARY OF THE INVENTION

In accordance with the invention there is provided a tuner for receiving information signals within a channel selected from within a plurality of channels and being within a predesignated frequency band, the tuner comprising: a first filter for providing a plurality of passbands each being exclusively selectable in response to a filter selection signal designating a corresponding one of the plurality of passbands, each of said passbands being characterized by a bandwidth being sufficiently broad to admit signals in at least one of the plurality of channels with lesser attenuation than other signals; an input port for receiving information signals and conducting the received information signals to the filter; an output port for conducting any signals having been admitted by the first filter; and, superheterodyne circuitry including a mixer and a second filter for processing any signals coupled thereto via the output port and discriminating the received information signals within the selected channel.

In accordance with the invention there is provided an integrated circuit tuner, responsive to a tuner controller signal, for receiving information modulated signals from a designated one of a multitude of channels in a predesignated band of frequencies, comprising: at least several switchable bandpass filters each being selectable for admitting signals in at least one of several channels in adjacent frequency bands in response to the control signal; an input port for receiving signals and conducting the received signals to said at least several bandpass filters; an output port for coupling any signals having been admitted via any of said at least several bandpass filters;

a superheterodyne circuit for discriminating the received information signals within the selected channel; and, a tuner controller port for receiving the tuner controller signal; said at least several bandpass filters each having a pass band characteristic being defined by a mutually exclusive central frequency and a bandwidth sufficiently broad to admit at least one of said channels with a substantially flat gain there being sufficient bandpass filters within said at least several bandpass filters to admit information signals within any designated channel; and, said at least several bandpass filters each including a switch for enabling the bandpass filter with energizing power, the switch being responsive to the tuner controller signal.

In accordance with the invention there is provided a television signal receiving appliance for receiving TV program information signals within a channel selected via a tuner controller, the receiving appliance comprising: an input port for receiving TV program information signals;

a filter selection signal port for receiving a filter selection signal; a tuner including a filter for providing a plurality of passbands each being exclusively selectable in response to the filter selection signal designating a corresponding one of the plurality of passbands, each of said passbands being characterized by a bandwidth being sufficiently broad to admit signals in at least one of the plurality of channels with lesser attenuation than other signals in response to an activating control signal from the tuner controller, the tuner also including superheterodyne circuitry with a mixer and a filter for discriminating the received information signals within the selected channel; and, detection and processing circuitry being responsive to the discriminated signals for generating a video signal and an audio signal; and one of an apparatus for visual display and sound reproduction of the video and audio signals and a recording apparatus for storing at least one of the video and audio signals as it occurs over a period of time, for future use.

In accordance with the invention there is provided an integrated front end filter in a tuner, comprising: a tuner controller port for receiving a control data signal from a tuner controller; and, a memory for storing a plurality of data corresponding to the selectable channels in combination with a tunable filter element, each data being stored at a predetermined location within the memory and reproduced in response to the corresponding control data signal from a tuner controller, each data characterizing one of a plurality of passbands each of a bandwidth being sufficiently broad to admit at least one of the plurality of channels in the received information signal with lesser attenuation than others of the plurality of channels, the tunable filter element being switchable from one passband to another in response to the control data signal.

In accordance with the invention there is provided a process of manufacturing a front end filter in a tuner with a plurality of data each data characterizing one of a plurality of passbands in combination with at least one tunable filter element and being assertible in response to a corresponding control data signal from a tuner controller, the process steps of: a) fabricating at least the front end filter in an integrated circuit form, b) storing each of the plurality of data at storage location being addressable by a corresponding one of the control data signals, whereby in subsequent use the tunable filter element is switchable from one passband to another in response to the control data signal. In accordance with the invention there is further provided a process of manufacturing a front end filter, the further process steps of: c) channel testing the tuner's performance by operating the tuner with a channel test signal selected from a plurality of channel test signals; and, d) if a result of the channel test is less than a predetermined standard, amending the data characterizing the passband to urge the result toward the predetermined standard; and otherwise, e) repeat step c) with each channel test signal until each of the channel test signals has been selected.

In accordance with the invention there is provided a method of receiving RF information modulated signals from a designated one of a multitude of channels in a predesignated band of frequencies, comprising the steps of: providing a plurality of switchably selectable bandpass filters each being selectable for admitting signals in at least one of several channels in adjacent frequency bands; determining a desired channel from the multitude of channels; generating a tuning signal in dependence upon the determined channel; receiving the tuning signal by the plurality switchably selectable bandpass filters; comparing the tuning signal to predetermined data within the plurality switchably selectable bandpass filters; enabling a single switchably selectable bandpass filter from the plurality of switchably selectable bandpass filters for which the tuning signal compares to the predetermined data; and, disabling the plurality of switchably selectable bandpass filters that are other than the single enabled switchably selectable bandpass filter.

In accordance with the invention there is provided a memory circuit having an output port coupled to each switch port from a plurality of switchably selectable bandpass filters each being selectable for admitting signals in at least one of several channels in adjacent frequency bands, the memory circuit having instructions contained therein for carrying of the steps of: determining a desired channel having information modulated signals therein from a multitude of channels each having information modulated signals therein; generating a tuning voltage in dependence upon the determined channel; and providing a tuning voltage to the output port coupled to the each switch port of the plurality switchably selectable bandpass filters.

BRIEF DESCRIPTION OF THE DRAWINGS

Embodiments of the invention are discussed with reference to the accompanying drawings in which:

FIG. 9 illustrates a block schematic diagram of an example of an active parallel resonant circuit, useful for providing a filter in accordance with an embodiment of the invention and intended for integrated circuit manufacture;

FIG. 10 illustrates a block schematic diagram of an example of a switchably selective filter including an active parallel resonant circuit as illustrated in FIG. 9, and is one example of a filter useful in the tuners of any of FIGS. 3, 6 and 8;

FIGS. 11a and 11b illustrates block schematic diagrams of lowpass and highpass circuit units, respectively, where any of which are variously useful for providing a filter in a tuner in accordance with an embodiment of the invention and intended for integrated circuit manufacture;

FIGS. 11c and 11d illustrates block schematic diagrams of selectively activatable lowpass and highpass circuits, respectively, incorporating the units illustrated in FIG. 11a and 11b respectively, and exemplary of filters useful in the tuners of any of the FIGS. 3, 7 and 8;

FIG. 12a illustrates a block schematic diagram of another example of a switchably selective filter including active high pass and low pass circuits illustrated in FIGS. 11c and 11d and is another example of a filter useful in tuners shown in either of any of FIGS. 3, 6 and 8;

FIG. 12b illustrates a schematic diagram of an alternate arrangement for providing variable gain control in the switchably selective filters illustrated in FIGS. 10 and 12a;

FIGS. 14a–14d illustrate graphical diagrams each having a vertical axis representing attenuation and a horizontal axis representing frequency, the graphical diagrams depict another example of a multitude of selectable passband characteristics in a tuner in accordance with the invention;

FIG. 14e illustrates a graphical diagram having a vertical axis representing attenuation and a horizontal axis representing frequency and illustrates expanded single channel passbands as compared with that depicted in FIG. 14a;

DISCUSSION OF PREVIOUS TV TUNERS

Figure 1:
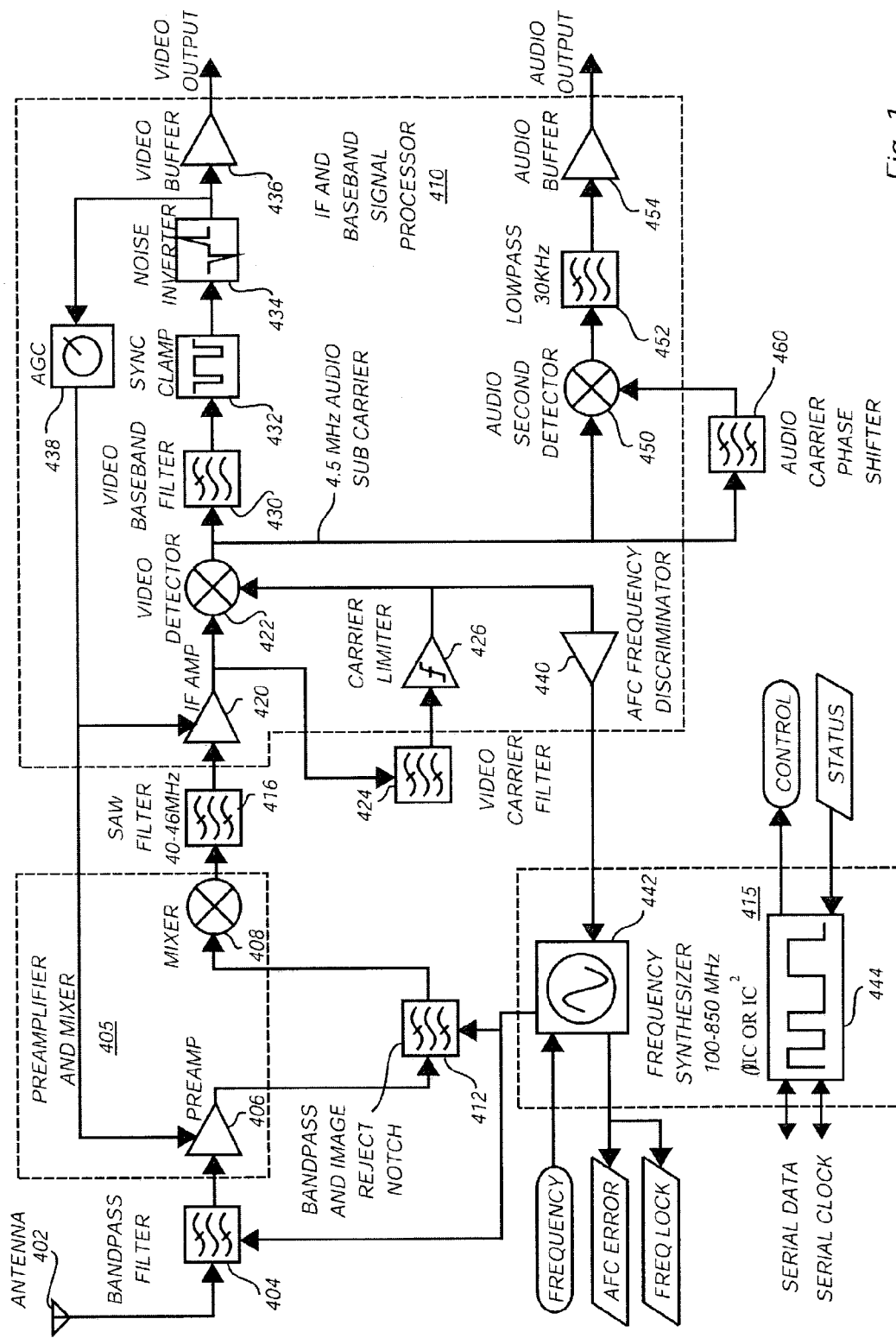
FIG. 1 illustrates a block schematic diagram of a television tuner with double conversion in accordance with that shown as prior art in the U.S. Pat. No. 6,177,964.

The prior art television (TV) tuner illustrated in FIG. 1, is shown as being state-of-the-art in a discussion of prior art U.S. Pat. No. 6,177,964, which issued to V. Birleson et al, on Jan. 23, 2001 and is titled "Broadband Integrated Television Tuner". It is believed that a review of the matter disclosed by Birleson et al. may be convenient for an appreciation of the present invention. The following review is generally that presented by Birleson et al.

Referring to FIG. 1, the prior art TV tuner is described as being highly miniaturized, but not fully integrated. The prior art TV tuner is intended to reside within in a single metallic shielding structure, not shown. The shielding structure contains a printed circuit board upon which all of the tuner components are mounted and electrically connected. Hence the prior art TV tuner is designed as a module, which is intended for mounting on any of other various printed circuit boards to allow for direct connection of the input and output signals to appropriate terminations within a television receiving system. The metallic shielding structure prevents undesired external signals from interfering with the operation of the prior art TV tuner and prevents the prior art TV tuner from radiating signals that might otherwise interfere with the operation of external devices.

The prior art TV tuner includes three integrated circuits: a preamplifier mixer circuit 405, an intermediate frequency (IF) and baseband signal processor 410 and frequency synthesizer, and an Inter Integrated Circuit (IIC or I2C) bus interface 415. The prior art TV tuner also includes discrete components, including a bandpass filter 404, a bandpass and image reject notch filter 412, a surface acoustic wave (SAW) filter 416, a video carrier filter 424, and an audio carrier phase shifter 460.

The prior art TV tuner receives a standard television RF signal from either an antenna 402 or a cable system connection (not shown) through the bandpass filter 404. The filter 404 is a narrow bandpass tracking filter which attenuates most of the television channels in distinction to the desired channel so that the potential of any interference from any undesired signals is reduced. The filter 404 reduces the image response caused by a first mixer 408 and also attenuates signals, not in a fairly narrow (100 MHz) range, about the desired signal. Finally, as the prior art TV tuner is specifically intended to operate with antenna supplied signals, known interference signals, such as FM broadcast, shortwave service signals, signals in the intermediate frequency band, and Citizen Band radio signals, are specifically rejected by the filter 404. The filter 404 is comprised of discrete elements, including capacitors, inductors and varactor diodes, A preamplifier 406, in the preamplifier and mixer circuit 405, receives signals from the output port of the bandpass filter 404 and raises the signal level (as much as 10 dB) with a minimum increase in noise level (typically 8–10 dB). The gain of the preamplifier 406 is controlled by an automatic gain control (AGC) circuit 438, so that when a very strong signal enters the prior art TV tuner, overall gain is reduced, resulting in less distortion in the preamplifier 406 than is realizable without gain reduction.

An output signal of the preamplifier 406 is sent to a bandpass and image reject notch filter 412, with the same basic requirement of minimizing the passage of potential interference signals. Filter 412 is external to the preamplifier and mixer circuit 405 and is comprised of discrete elements, including capacitors, inductors and varactor diodes.

An output signal of the bandpass and image reject notch filter 412 is then sent to the mixer 408, in the preamplifier and mixer circuit 405. The mixer 408 mixes the output signal of the filter 412 with a local oscillator signal from an output port of a frequency synthesizer 442 in the frequency synthesizer and I2C bus interface 415. The frequency synthesizer 442 is operated to provide the local oscillator signal having a frequency chosen to be higher than the desired receiver carrier by 43.75 MHz, and thus the difference signal output from the mixer 408 is at 43.75 Hz. There also is an image signal due to the operation of the mixer 408 at 91.5 MHz above the input frequency, which is removed by the bandpass filter 404 and the filter 412 under the control of the I2C 415. As the signal frequency of the frequency synthesizer 442 is tuned to receive signals of different carrier frequencies, the bandpass filters 404 and 412 are tuned to properly pass only the desired signals and not mixer images.

The frequency synthesizer 442 receives an input frequency reference signal (usually 16 bits) and outputs status signals, AUTOMATIC FREQUENCY CONTROL (AFC) ERROR and FREQUENCY (FREQ) LOCK. Additionally, a tuning signal, which is used by a voltage controlled oscillator (VCO) (not shown) in the frequency synthesizer 442, is output from frequency synthesizer 442 to the bandpass filters 404 and 412, to effect the tuning thereof.

A 43.75 MHz output signal of the mixer 408 passes through a surface acoustic wave (SAW) filter 416, which reduces the bandwidth of the signal to only one channel (6 MHz for the NTSC standard) and applies a linear attenuation in frequency known as the Nyquist slope around the visual carrier frequency. The linear attenuation by the SAW filter 416 converts the signal from a vestigial sideband signal to one that is equivalent to a single sideband with an added carrier. A significant disadvantage of the SAW filter 416 is that it is typically very lossy, about 25 dB across its passband. Hence the input signal provided to SAW filter 416 is amplified by a preamplifier (not shown) with low output impedance by a corresponding amount to minimize noise effects. Heat generated by the power amplification and the SAW filter attenuation is significantly large as compared with other functions in the prior art TV tuner.

The output of SAW filter 416 is received by an IF amplifier 420, in the IF and baseband signal processor 410. The IF amplifier 420 provides signal gain as controlled from an automatic gain control (AGC) circuit 438, preparatory to further signal processing.

The output of the IF amplifier 420 is received by a video detector 422 and is also sent off-chip to the external video carrier filter 424. This is the stage at which video demodulation is performed. The video detector 422 is a mixer with its local oscillator input port connected to the output port of the video carrier filter 424 via a carrier amplitude limiter 426. The output of the carrier limiter 426 is an in-phase representation of the video carrier signal limited to remove any amplitude modulation. The output of the carrier limiter 426 is received by the video detector 422, which mixes the output of the carrier limiter 426 with the output of IF amplifier 420. An AFC frequency discriminator 440 is used in the prior art TV tuner to detect any difference between the carrier frequencies contained in the video carrier signal from the carrier limiter 426 and a known valid carrier frequency reference to produce an error signal. The error signal drives the frequency synthesizer 442 in a direction for reducing the error between the output of carrier limiter 426 and the known valid carrier frequency reference. The output of the video detector 422 is a baseband video signal combined with several high frequency mixing artifacts, where a video baseband filter 430 removes these artifacts. The output signal of video baseband filter 430 is fed to a synchronization pulse clamp (sync clamp) 432, which sets the level of the sync pulses to a standard level. The output signal of sync clamp 432 is sent to a noise inverter 434, which removes any large noise spikes from the signal. The output signal from the noise inverter 434 is sent to a video buffer 436, which is usually configured to drive circuit board impedances of about 1000 to 2000 ohms via a video output port.

The output signal from the noise inverter 434 is also sent to the AGC circuit 438, which compares the level of the synchronization pulses to a signal blanking level, to measure the incoming signal strength, and generates a gain control signal, which is used by the IF amplifier 420 and RF preamplifier 406 to dynamically adjust the gain of the prior art TV tuner for the desired signal level at the video output port.

The baseband video signal at the output port of the video detector 422 also includes an audio signal in the form of a frequency modulated (FM) subcarrier signal at 4.5 MHz. The FM subcarrier is transmitted to an audio second detector, in this example an FM quadrature demodulator. The FM quadrature demodulator includes a mixer, 450 and an audio carrier phase shifter 460. The audio carrier phase shifter 460 shifts the audio subcarrier of 4.5 MHz by 90 degrees. The mixer 450 mixes the FM subcarrier signal with the 90 degree phase shifted signal to provide a baseband audio signal, which is filtered by a lowpass (30 kHz) filter 452 to remove any undesired high frequency components. The output signal from the lowpass filter 452 is passed on to an audio buffer 454 that provides an audio signal at an audio port.

A serial digital interface 444 receives SERIAL DATA and SERIAL CLOCK input signals to provide control and update status for the television receiver.

The bandpass filters 404 and 412 are typically comprised of a plurality of capacitors, inductors and varactor diodes. The video carrier filter 424 is usually comprised of three discrete elements: an inductor and two capacitors. Likewise, audio carrier phase shifter 460 is also comprised of an inductor and two capacitors. In addition to the circuit elements shown as discrete components outside of the circuit elements 405, 410 and 415 shown in FIG. 1, other discrete components (not shown) are connected to the IF and baseband signal processor 410 and to the frequency synthesizer 442 for tuning purposes. Several external capacitors, inductors and/or varactor diodes typically tune the frequency synthesizer 442. The video buffer 436 and the audio buffer 454, typically employ external discrete elements, such as resistors, capacitors and/or transistors. The video baseband filter 430 and lowpass filter 452 may also employ external inductors and capacitors. All external components electrically connected to any of the integrated circuits 405, 410 and 415 are connected therewith via "pinouts". The cost of the integrated circuit is, more typically than not, proportional to the number of external connections or pinouts required. Hence numerous external components associated with any integrated circuit dictate a cost penalty for the integrated circuit, which may seriously infringe upon the advantageous of miniaturization.

Figure 2:
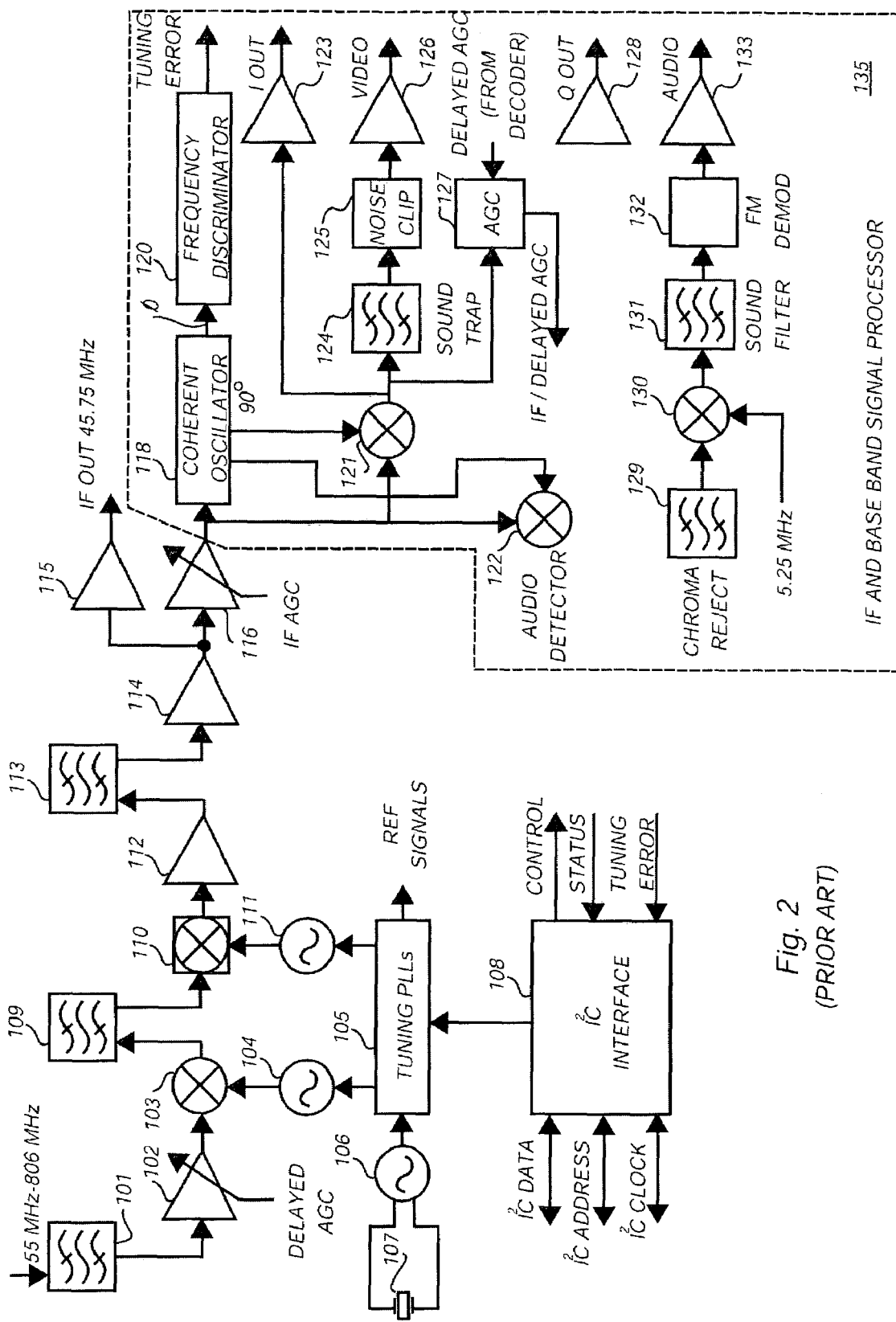
FIG. 2 illustrates a block schematic diagram of a television tuner intended for manufacture by integrated circuit manufacturing methods, substantially as disclosed in the U.S. Pat. No. 6,177,964.

Birleson et al. teach a broadband television tuner, as is shown in the block diagram of FIG. 2. RF signals in a range of 55 Mhz to 806 Mhz are received in the tuner through an input filter 101. The input filter 101 operates to attenuate signals above an input cut-off frequency corresponding to the highest frequency expected in the television band. As distinguished from the prior art TV tuner shown in FIG. 1, the input filter 101 is not tuned to select a few channels but instead passes all channels in the television band.

Radio frequency RF signals passing through the input filter 101, are amplified by an amplifier 102. The amplifier 102 operates with a gain as determined by a delayed AGC signal. The amplifier 102 may be provided by either a variable gain amplifier or a variable attenuator coupled in series with a fixed gain amplifier. In any event, this requires that the amplifier 102 be a low noise amplifier (LNA) having a high linearity with respect to the entire television band of frequencies and one that offers a wide dynamic range with respect to received RF signal amplitudes. Preferably the amplifier 102 has a transmission band that is sufficient to pass the entire television band. The amplifier 102 functions to control high input signal levels in the received RF signal since the tuner is capable of receiving signals from a variety of sources, such as an antenna or a cable television line. Typically, one or several antenna channel signals are strong in power, while the remainders are much weaker. This requires that the amplifier 102 have a very broad dynamic range in order that both the weaker signals and the stronger signals be received satisfactorily. In contrast, cable television signals may have signal strengths of +15 dBmV and may comprise 100 cable channels. The amplifier 102 must regulate in accordance with the varying signal levels in this broadband of received channels.

A mixer 103 receives input signals from the AGC amplifier 102 and a local oscillator 104. A first IF signal is generated in the mixer 103 and is provided to a first IF filter 109. The first IF filter 109 is a bandpass filter that provides coarse channel selection. As a matter of design choice, the first IF filter 109 may be constructed on the same integrated circuit substrate as mixers 103 and 101 or the first IF filter 109 may be a discrete off-chip device such as a radio frequency SAW filter. The first IF filter 109 is constructed to select a narrow band of channels, or perhaps only a single channel, from the television signals in the first IF signal.

A mixer 110 mixes the first IF signal from the first IF filter 109, with a second local oscillator signal from a local oscillator 111 to generate a second IF signal. The mixer 110 may be an image rejection mixer, if necessary, to reject unwanted image signals. The characteristics of the first IF filter 109, determines whether or not the mixer 110 must function to provide image rejection. If image frequencies of any desired channel are adequately attenuated by the first IF filter 109, then the mixer 110 may be a standard mixer.

Tuning phase locked loop (PLL) circuits 105 control local oscillators 104 and 111. Local oscillator frequencies are selected under the control of an Inter Integrated Circuit (IIC or I2C) bus interface 108, so that the picture carrier of a particular channel in the RF television signal spectrum appears at 43.75 MHz in the second IF signal. Of course, some other frequencies may be provided depending on the standards in a particular region or country where the TV tuner is intended for use. The tuning PLL circuits 10S receive reference signals from a reference oscillator 106, which is driven by a 5.25 MHz crystal 107. The I2C interface 108 provides control signals to the tuner 10 and monitors the status of the tuner 10 and the tuning PLL circuits 105.

In operation, the front end of the TV tuner receives the entire television band through the filter 101 and the amplifier 102. The mixer 103 up-converts the RF input signal so that a selected channel in the RF signal appears at a first IF frequency that is selected to pass through the filter 109. The first IF frequency is then down-converted to a second IF frequency of 43.75 MHz by the mixer 110. The frequency of the first local oscillator signal varies depending upon the specific channel desired in the RF signal. The second local oscillator is also optionally tunable when the second IF frequency is selected to be other than the typical 43.75 MHz.

Following the mixer 110, an amplifier 116, under the control of the AGC signal, amplifies the second IF signal. Signals being passed by the filter 113 either remain on-chip for further processing or can be provided to an off-chip device, such as a decoder (not shown), through a buffer 115. The amplifier 102 and the amplifier 116 operate in conjunction to control the overall signal level preparatory to further processing by circuit elements 118, 120–133. These circuit elements are connected as shown to provide an IF and baseband signal processor 135.

It is suggested that the second IF filter 113 may be constructed on the same integrated circuit substrate as the other elements of tuner, or it may be a discrete off-chip device. The amplifiers 112 and 114 are used to provide proper impedances for the SAW filter 113 as well as to provide gain to maintain system noise performance. The amplifier 112 must provide a powerful signal at the relatively low impedance preferred for operation of the SAW filter. Heat generated by the power amplification and the SAW filter attenuation is significantly large as compared with other functions in the prior art TV tuner.

DESCRIPTION OF EMBODIMENTS IN ACCORDANCE WITH THE INVENTION

Figure 3:
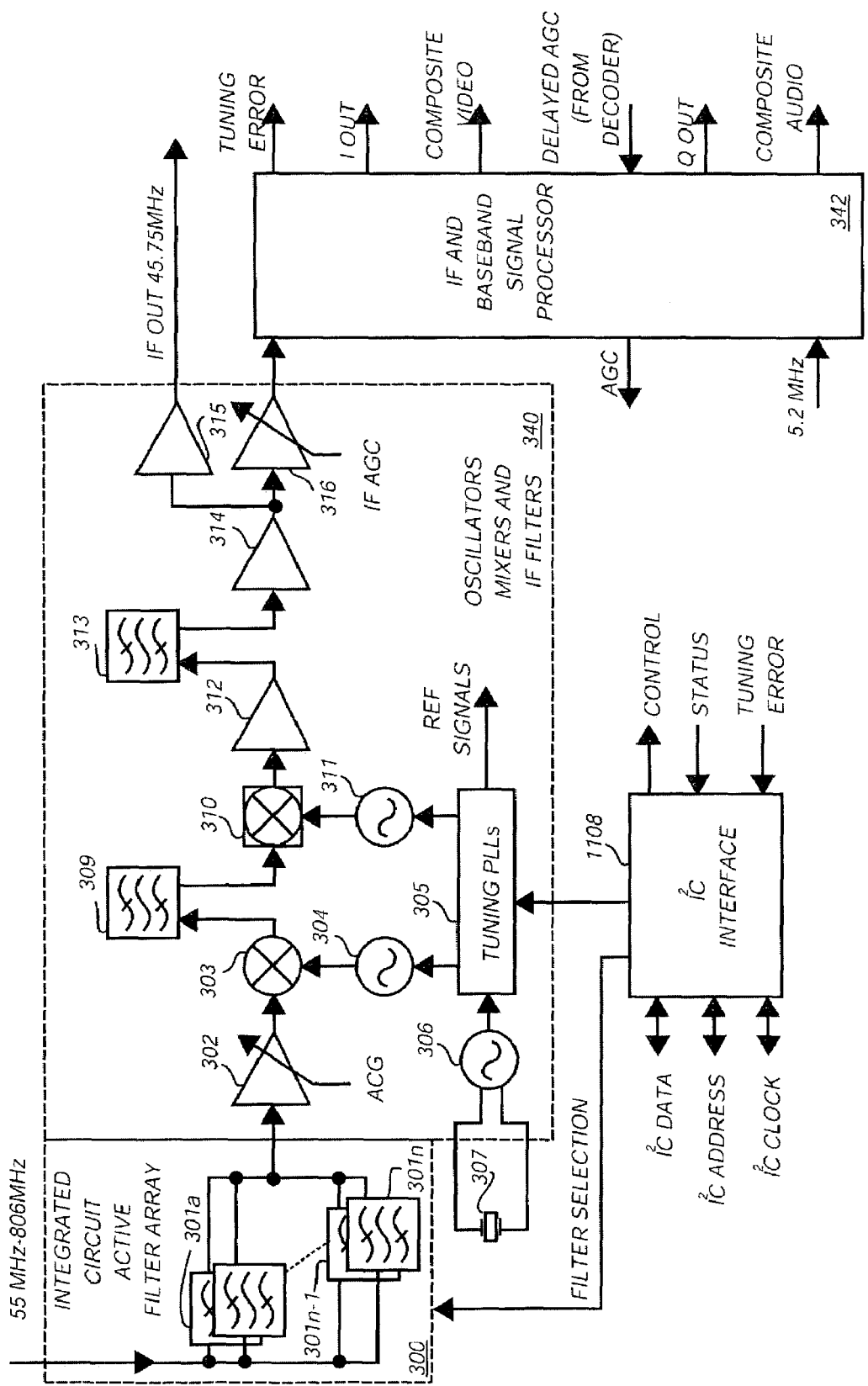
FIG. 3 illustrates a block schematic diagram of an example of a tuner which includes a filter at an input port thereof, in accordance with an embodiment of the present invention and intended for manufacture by integrated circuit manufacturing methods.

Referring to FIG. 3, the tuner receives RF signals in the television band from either an antenna or a cable connection (not shown) via an integrated circuit active filter array 300 having at least several passbands, which are illustrated for diagrammatic convenience as several filter elements 301a–301n. Each of the filter elements 301a–301n is selectable to pass signals in a desired channel in dependence upon a tuning signal, typically a channel in a nationally designated television frequency band. The selected channel signals are passed to an oscillators mixers and IF filters circuit 340, which is likewise provided in an integrated circuit. The oscillators mixers and IF filters circuit 340 is preferably provided on the same integrated circuit substrate as the input filter 300. Circuit elements 302–306 and 309–316, connected as illustrated, create the oscillators mixers and IF filters circuit 340. These circuit elements, as well as a crystal 307, shown off chip, function to discriminate the received information signals within the selected channel in a manner generally similar to the circuit elements labeled 102–107 and 109–116, previously discussed with reference to FIG. 2. An I2C interface 1108 is coupled to control selection of one of the filter elements 301a–301n using the tuning signal and to control the frequencies of local oscillator signals for reception the desired channel. Signals from the amplifier 315 are passed for further processing to an IF and baseband signals processor 342. The IF and baseband signals processor 342 functions in a manner somewhat similar to the circuits labeled 410 and 135 in FIGS. 1 and 2, respectively. The IF and baseband signals processor 342 requires the discriminated signal to be of at least a minimum quality, in other words of at least a minimum signal to noise ratio (SNR), in order to provide for a satisfactory presentation of the video and audio information at an output port of the tuner.

It should be understood that the signals passed by the selected one of the filter elements 301a–301n to the circuit 342 are of a restricted range of frequencies and are not broadband signals. Depending upon the degree of restriction, the functions of the oscillators mixers and IF filters circuit 342 do not need to be as precisely performed as would otherwise be required, as for example in the tuner illustrated in FIG. 2. The tuner in FIG. 2 can be flooded with a wide range of signals having a wide variety of signal strengths, as these may be present in the television and other interleaved service bands, depending upon the operating location. Hence, a very linear broad dynamic range LNA, and double conversion are required. Furthermore, satisfactory performance of the tuner in FIG. 2 is jeopardized unless precision "off-chip" filters are used.

Figure 13:
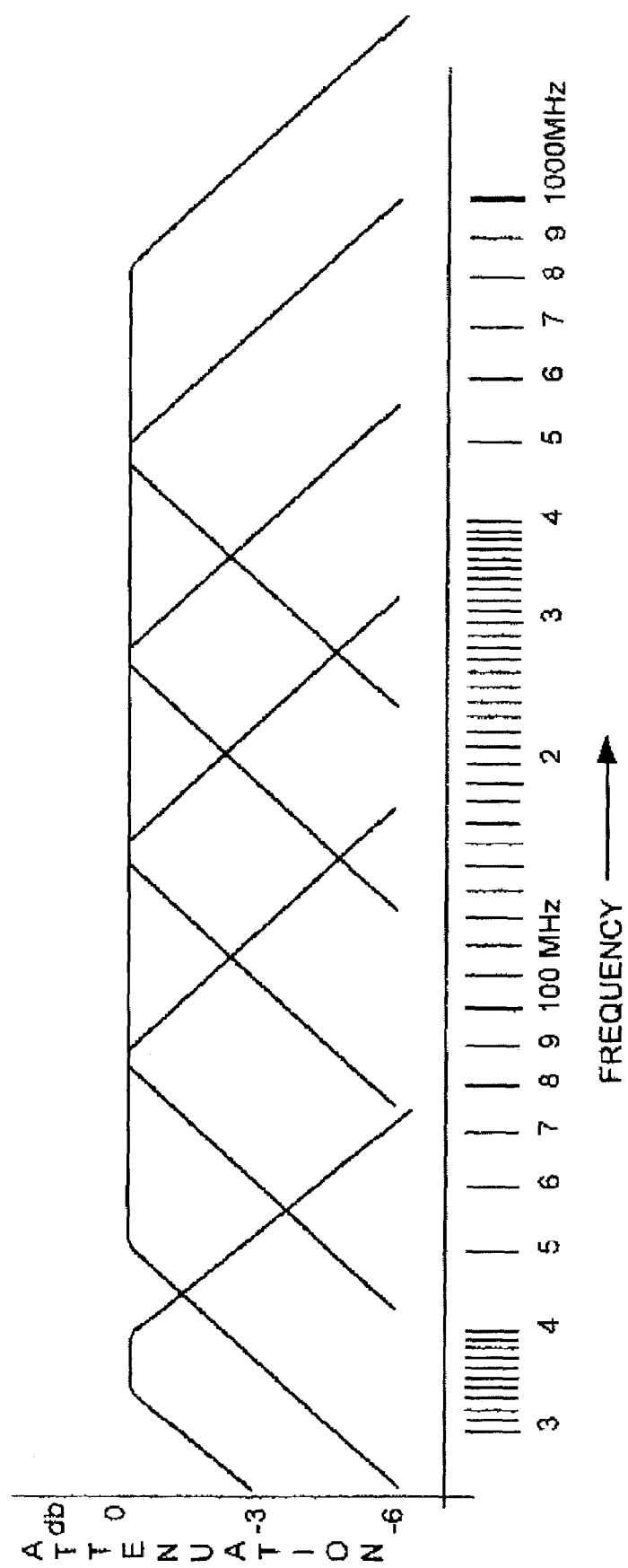
FIG. 13 illustrates a graphical diagram having a vertical axis representing attenuation and a horizontal axis representing frequency, the graphical diagram depicts an example of a plurality of selectable passband characteristics for a filter in a tuner in accordance with an embodiment of the invention.

There are various filter arrangements in accordance with the present invention. Each filter element 301a–301n, in one example of FIG. 3, is limited to providing a passband function suitable for passing signals of one channel with lesser attenuation than signals of any other channel. In another example, a filter element, or several filter elements, each provide a plurality of selectable passbands. In yet another example, only the lower frequency filter elements have passbands, which are limited to a single channel, while the upper frequency filters may pass as many as 8 adjacent channels, somewhat as illustrated in FIGS. 14a–14d. In a further example, the filter passband characteristics may be somewhat like those exemplified in FIG. 13. In this example, 1 of 5 filters each provides for selection of about 1 octave of the television band of frequencies, while a sixth filter is provided to pass other service signals in a lower band of frequencies.

Following filter 301, the RF signal passes through delayed AGC amplifier 302, which operates in conjunction with IF AGC amplifier 316, to control the overall signal level in tuner 30 amplifier 302 is a variable gain amplifier or a variable gain attenuator in series with a fixed amplifier. The preferred embodiment of amplifier 302 comprises a low noise amplifier (LNA) with a linearity that is sufficient to pass an octave in the television band. When the filter array 300 is integrated, the LNA 302 is optimally integrated therewith to provide linearity across only the widest bandwidth of each of the filter elements 301a–301n. As such, relaxed requirements of the overall LNA design result. Alternatively, each of the plurality of filters comprises a LNA for amplifying the associated frequency band.

There is a need for tuner devices of minimal power consumption for use in various receiving appliances. As is generally known by those of skill in the art, the use of narrower band filtering to pass a smaller selection of channels to the oscillators mixers and IF filters circuit 340, allows for circuits designed for the least possible power consumption and heating within the tuner. In the present embodiment, narrower band filtering at the input permits simpler filters throughout and allows for integration of the tuner within an integrated circuit, while providing adequate performance.

In the description of the remaining Figures, elements of substantially the same functions are identified with the same or somewhat similar numerical labels.

Figure 4:
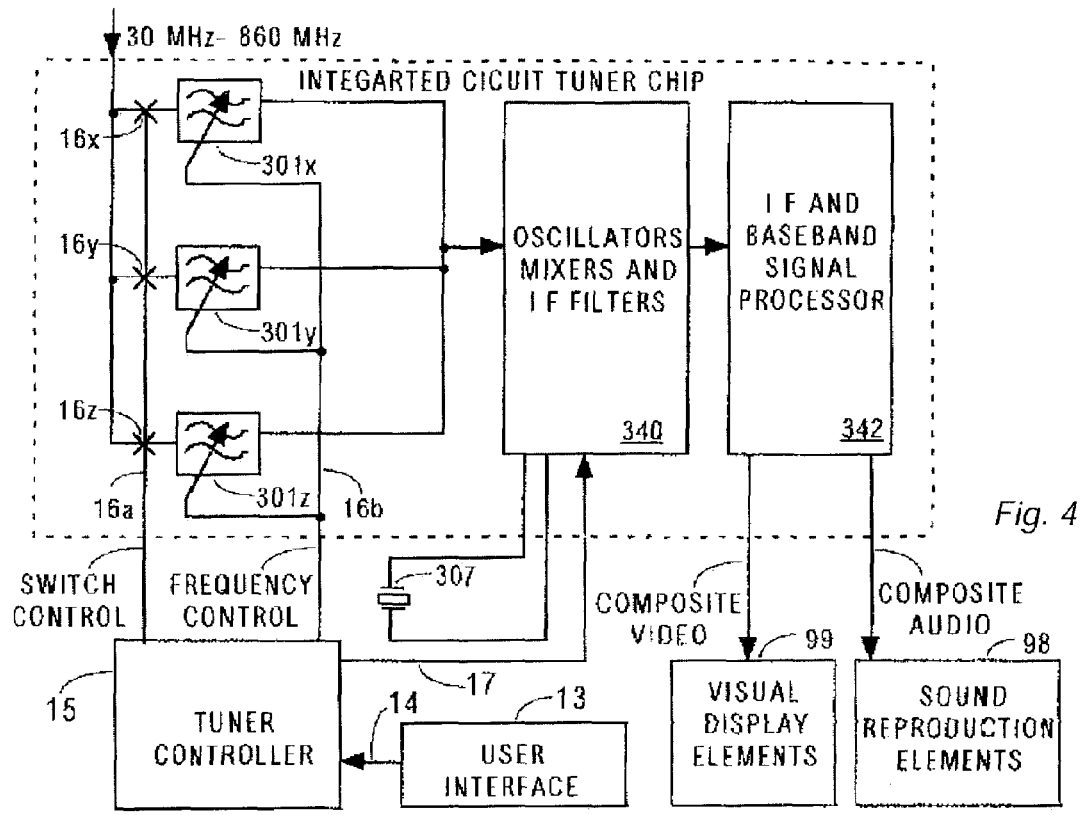
FIG. 4 illustrates a block schematic diagram of an example of a television set having a tuner, which includes a plurality of variable filters at an input port thereof, in accordance with an embodiment of the invention.

The TV set illustrated in FIG. 4, uses a tuner similar to that shown in FIG. 3, but with the array of selectable filter elements 301a–301n replaced by a plurality of a tunable switched active filters 301x–301z, each spanning an octave, or more, such that in combination complete coverage of at least the TV signal band is provided. Similar to the embodiment shown in FIG. 3, oscillators mixers and IF filters 340 and an IF and baseband signal processor 342 provide composite video and audio signals. Visual display elements 99 and sound reproduction elements 98 present received program information to a user. A tuner controller 15 provides filter selection via a lead 16a, frequency control via a lead 16b, and local oscillator frequencies via a bus 17. Each of the tunable filters 301x–301z is associated with a corresponding switch 16x–16z, depicted in an abbreviated form, for convenience of illustration. Actuation of any one of the switches 16x–16z activates the associated tunable filter and couples antenna or cable received signals to the associated tunable filter. The tunable active filter circuit is mainly concerned with removing extraneous signal components and maintaining linearity across a selected channel. Design of a passband filter with sufficient bandwidth linearity across a single channel is within the skill of those of skill in the art and is summarized in principle, for example, on pages 74–78 of "Applications Manual for Operational Amplifiers" published by Philbrick/Nexus Research of Dedham Mass. 02026 with a Copyright dated 1968, incorporated herein by reference.

In operation, the tuner controller 15 responds to signals from a user interface 13, coupled to the tuner controller 15, via a link 14, which may be a wired link, or any of several varieties of wireless links, or coupled from a keyboard, mouse or verbal command application of an associated personal computer. In the example of a personal computer, the sound and video elements 98 and 99 are elements of the personal computer when operating with a television viewing applications program. The tuner controller selects an appropriate tunable filter and generates a control signal for switching to the desired passband of the selected tunable filter, as well as generating the appropriate local oscillator frequencies.

Figure 5:
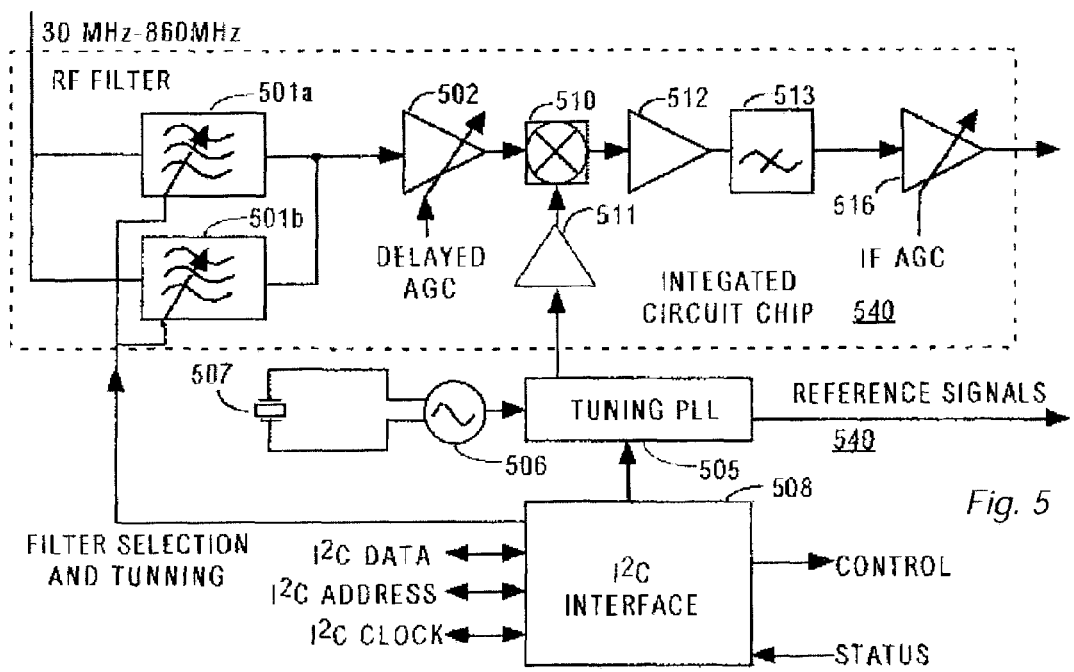
FIG. 5 illustrates a block schematic diagram of a tuner with a variable filter and with single conversion in accordance with the invention and intended for manufacture by integrated circuit manufacturing methods.

As shown in FIG. 5, the tuner is a single conversion tuner in contrast to that previously discussed. The tuner includes an integrated circuit 540 with an input filter provided by a pair of tunable integrated filter circuits 501a and 501b. Circuit elements 502 and 516 are variable gain amplifiers, which regulate the overall gain of the signal path in the integrated circuit chip 540. Signals from the amplifier 502 are mixed with a signal from a buffer amplifier 511 in a mixer 510. An amplifier 512 buffers the mixed signals, where they are thereafter filtered via a fixed channel filter 513. Signals passed by the filter 513 are passed on to on-following processing circuits, not shown, via the amplifier 516. In this example, off chip elements include a crystal 507, which controls an oscillator 506, which provides a reference signal to a tuning PLL circuit 505. Responsive to a control signal from an I2C interface 508, the tuning PLL 505 generates a local oscillator signal at a low-level, to avoid excessive stray coupling. The low-level local oscillator signal is amplified, on chip, for use by the mixer 510. Use of artificial inductors within the filters 501a and 501b allows for integration of the selectable filter component within the tuner, thereby reducing parts count, size, and significantly minimizing power consumption of the tuner. Also, pins are not required for providing the filtered signal or signals to the tuner integrated circuit and the integrated circuit components used to support those pins is obviated. Artificial or active inductors are known in the art of circuit design and are described in detail in U.S. Pat. Nos. 5,726,613; 6,028,496; and 6,130,832, as well as in other literature and are well known to those of skill in the art. A tunable active inductor is described in U.S. Pat. No. 6,211,753. Comparatively, a small amount of filter linearity is lost when straying from prior art discrete filter components, but such is of little or no consequence over the achieved narrow bandwidth.

Figure 6:
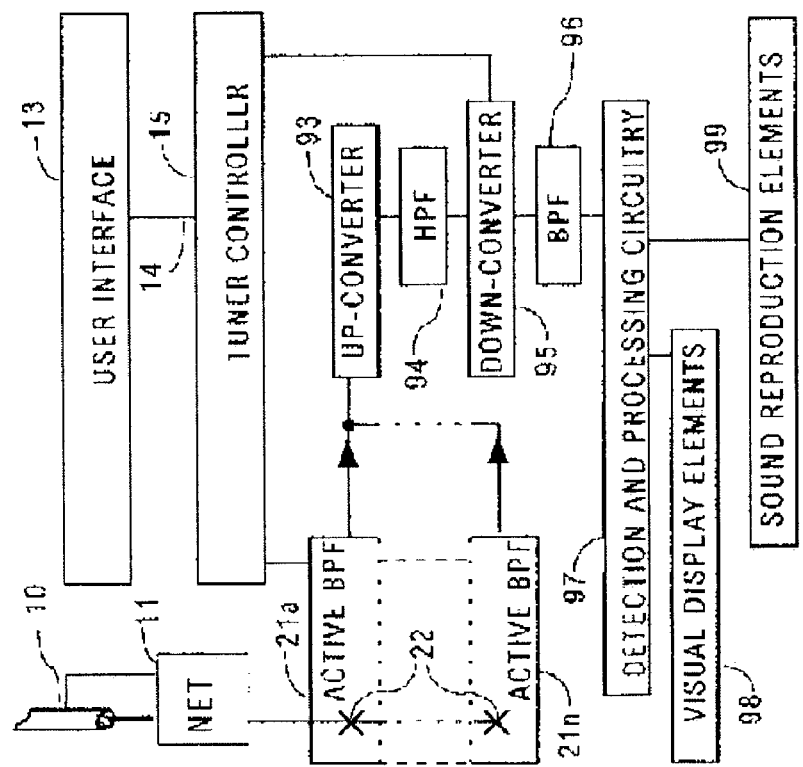
FIG. 6 illustrates a block schematic diagram of a television set having a tuner with several selectable passband filters at an input port thereof, in accordance with an embodiment of the invention.

The television set shown in FIG. 6 is shown having a tuner coupled with a cable feed 10, via a protection network 11, which functions to substantially protect the on-following circuitry from otherwise potentially harmful events such as power line crosses and lightening strikes. TV signals, and any other information signals, in a band, or bands, of frequencies extending from as low as about 30 MHz to as much as a GHz are supplied by the cable feed 10 and are passed directly to an array of active passband filters (BPF) 21a–21n. One of the active BPFs 21a–21n is connected to receive signals from the cable feed via an associated one of switches 22. The active BPF is chosen by a tuner controller 15, which causes the associated switch to become conductive. The tuner controller 15 acts in response to a control signal from a user interface 13 coupled via a link 14 which may be a sonic, radio frequency, photonic or wired link. An up-converter 93 converts the signal from the chosen one of the active BPFs 21a–21n to a frequency, which is at least more than twice the highest frequency passband of any of the active BPFs 21a–21n. A highpass filter 94 has a roll-off characteristic that attenuates any signal frequencies from the up-converter 93, which are lower than said twice highest frequency. In this example, the up-converter 93 provides is own local oscillator. However as an alternative, the local oscillator signal is supplied from, or controlled by, the tuner controller 15 to be of such a frequency that the mixed signals of a selected channel provide an IF in the passband adjacent the roll-off of the highpass filter 94. A down-converter 95, under the control of the tuner controller 15, down-converts signals passed by the highpass filter 94 so that a channel signal intended for reception falls within the passband of a bandpass filter 96. Typically, the passband is about 6 Mhz wide and lies in a region of about 43.5 Mhz, however the passband could be selected to be at some other central frequency, such as 21 Mhz, or at baseband, for example. The TV receiver includes visual display elements 98 and sound reproduction elements 99, the functions of which are adjustable from the user interface 13 via control paths (not shown). The visual display elements 98 and the sound reproduction elements 99 accept signal information prepared by detection and processing circuitry 97 in response to the channel signal from the bandpass filter 96. The detection and processing circuitry 97 may be integrated with the other tuner elements or may reside separately in the TV receiver.

Figure 7:
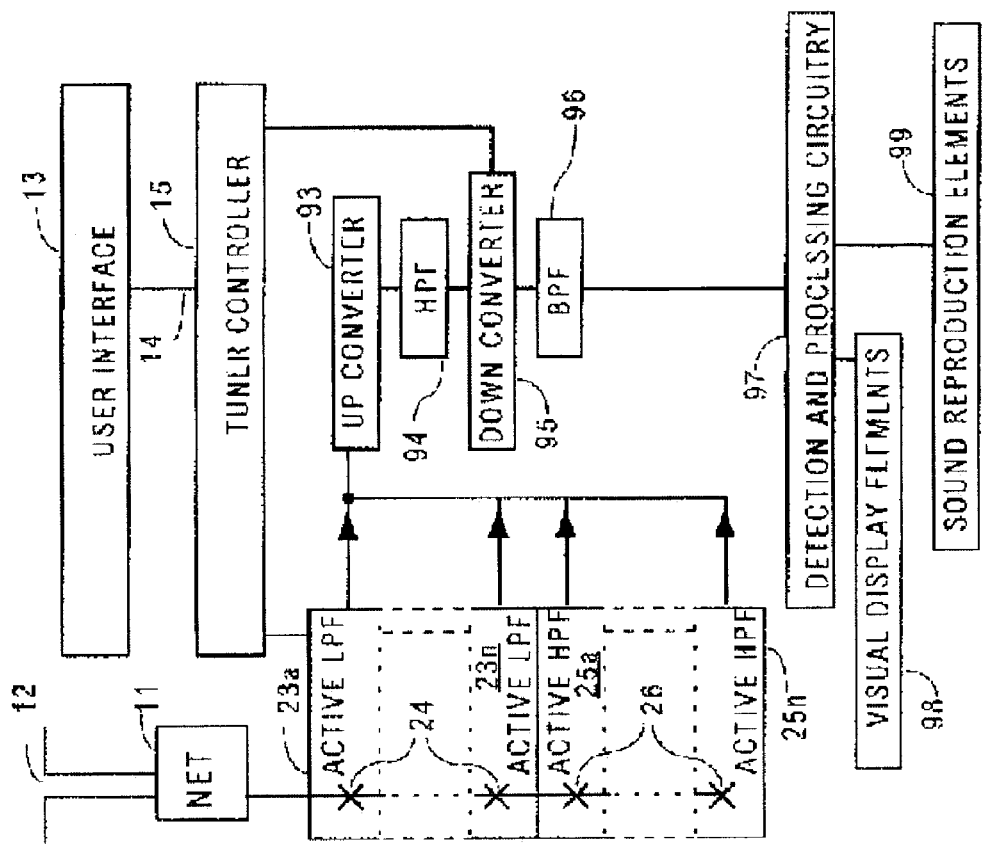
FIG. 7 illustrates a block schematic diagram of a television set having a tuner with a plurality of lowpass filters and a plurality of highpass filters at an input port thereof in accordance with an embodiment of the invention.

The TV set illustrated in FIG. 7 is similar to that shown in FIG. 6, with the exception that the input to the tuner is provided by an array of active lowpass filters (LPF) 23a–23n and an array of highpass filters (HPF) 25a–25n. Each of the active LPFs 23a–23n is associated with one of switches 24 and each of the active HPFs 25a–25n is associated with one of switches 26. In operation, one of the LPFs 23a–23n and one of the HPFs 25a–25n are enabled, in parallel, to provide a passband filter function for signals received at an antenna 12. Accordingly, the functional passband width is switchably selected to either be wider, narrower, or similar to the typical TV channel bandwidth. As such, the bandwidth of the tuner is preferably optimized to receive information signals of another bandwidth, for example an audio frequency modulation carrier broadcast in the FM broadcast band.

Figure 8:
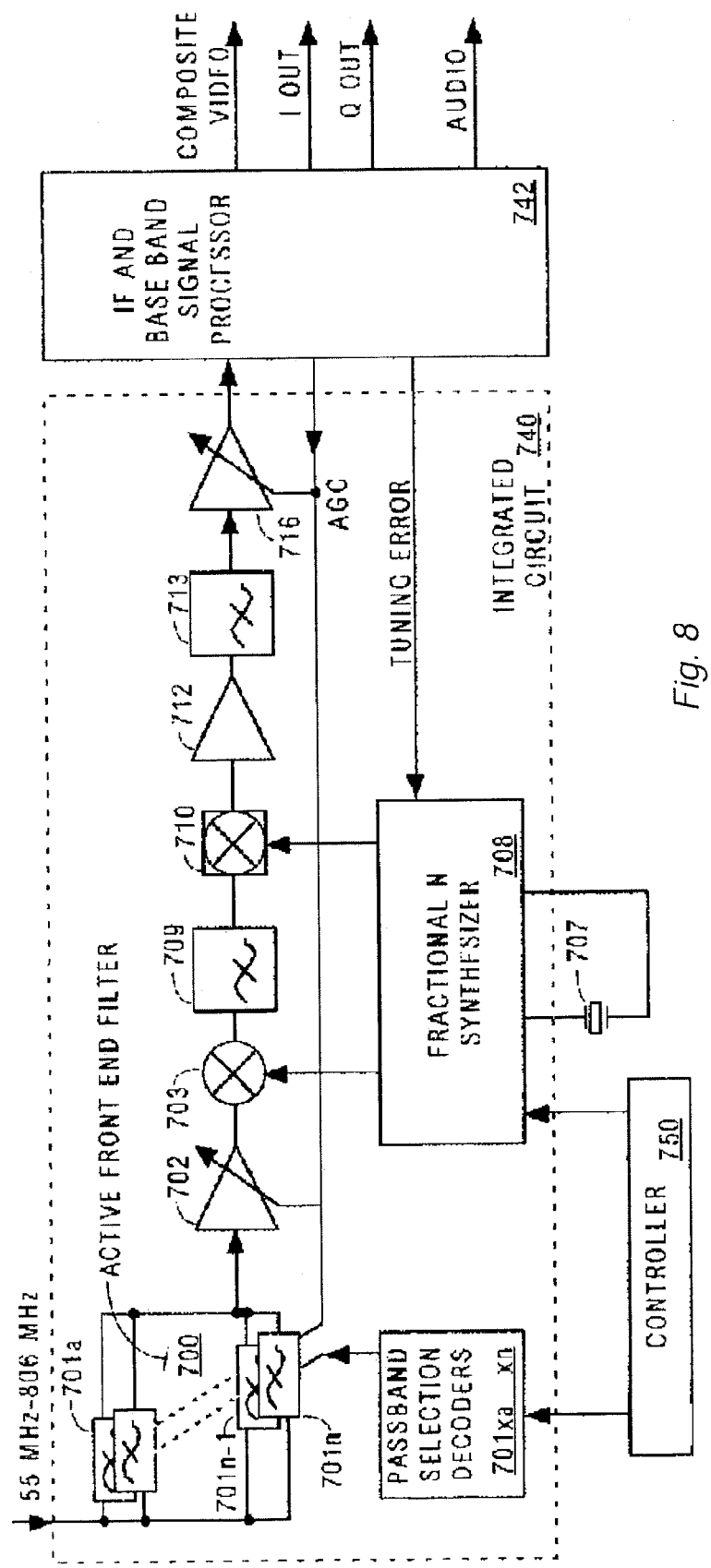
FIG. 8 illustrates a block schematic diagram of a television tuner, which includes a multiplicity of selectable passbands provided by an active front-end filter and having a synthesizer, in accordance with an embodiment of the invention and intended for manufacture by integrated circuit manufacturing methods.

Referring to FIG. 8, a block diagram of a tuner is shown in accordance with an embodiment of the invention. This tuner utilizes a fractional-N synthesizer architecture, sometimes referred to as a fractional-N synthesizer, for reducing noise. FIG. 8 illustrates an integrated circuit 740, coupled with a controller 750, a crystal 707 and an IF and baseband signal processor 742 to provide a TV tuner. The integrated circuit 740 includes an array of filter elements 701a–701n, each filter element is associated with a passband selection decoder in corresponding array of selection decoders 701xa–701xn. A controller 750 is connected to the integrated circuit 740 to control a selection of one of at least several passband characteristics represented by the filters 701xa–701xn. The selected filter passes signals of at least one channel to a variable gain LNA 702. The variable gain LNA 702, in conjunction with a variable gain amplifier 716, controls the overall gain of a signal path, in the integrated circuit 740, under the control of an AGC signal from the IF and baseband signal processor 742. A fractional-N synthesizer 708 is responsive to the controller 750 and a signal from a crystal 707 for generating appropriate local oscillator signals that are provided to mixers 703 and 710. Mixer 703 up-converts the at least one channel of signals from the LNA amplifier 703, where this up-converted signal is filtered in a filter 709 to at least eliminate any lower frequency artifacts from the mixer 703. The signal passing through the filter 709 is down-converted by the mixer 710 to frequencies at which the desired channel signal is passed by a passband filter 713 to the substantial exclusion of any undesired signal. The selected channel signal is provided from the signal path at the output port of the amplifier for further processing by the IF and baseband signal processor 742. As the name implies, the fractional-N synthesizer 708 uses a very small division ratio within the synthesizer and is thus capable of very small adjustments in local oscillator frequencies it provides to the mixers 703 and 710, in response to a tuning error signal from the IF and baseband signal processor 742. This substantially precludes phase noise that may otherwise be generated through the mixing process.

An important factor for current and future tuner design is phase noise. Phase noise is the relative power of undesired phase modulation with respect to the desired frequency. Phase noise dramatically affects modulation formats, such as QAM 256 and QAM 1024, since information is phase encoded. Demodulators for QAM waveforms operate by tracking the carrier phase in order to detect the phase encoded information. Phase noise degrades tuner performance and therefore any phase noise introduced via a local oscillator signal reduces the QAM modulation techniques implementable within a tuner. Too much phase noise degrades the tuner's effective SNR performance and consequently the effectiveness of modulation for ensuring error-free signals. Since the above noted integrated filters are not as linear as discrete filter components, reduction of other sources of noise allows for more slack in the performance requirements of other portions of the tuner circuit. The use of the fractional-N synthesizer architecture thereby optimizes tuner performance.

Examples of components employing fractional-N synthesizers are available from many major manufacturers including Philips®, Fujitsu®, and Broadcom®, to name but a few. The design and implementation of fractional-N synthesizers is known in the art and is within the skill of the typical integrated circuit designer with knowledge of synthesizers and synthesizer design. The use of a fractional-N synthesizer within a cable tuner circuit allows for the benefits of the fractional-N synthesizer as well as for the unforeseen advantages of supporting more integration for the tuner device and while optimizing performance. Further, the use of all of the above noted power saving techniques allows for greatly reduced power consumption by a tuner. This enables a cable tuner that is capable of operating with its energizing power being received from the service provider's cable feed. Heretofore this has been considered impractical because of the significant power consumption of a multitude of tuners, which are typically connected to any cable feed.

Referring to FIG. 9, the active parallel resonant circuit unit 30 includes an artificial inductance 31 with a pair of terminals 31a and 31b, a ground lead shown connected to ground, and a power lead V. Also included is a capacitance 32 connected across the pair of terminals 31a to provide a functional LC (inductor capacitor) parallel resonant circuit. A pair of varactor diodes, as shown, provides the capacitance 32. The varactor diodes have predetermined dimensions and are operated at an appropriate bias, provided by a source not shown, to provide a required capacitance value for the capacitance 32. In a somewhat similar configuration, a pair of varactor diodes (not shown) provides for a capacitive element in the artificial inductance 31 and determines its effective inductance value. The circuit unit 30 is an example of a parallel resonant circuit which functions as an impedance to a signal applied across the terminals 31a and 31b. The circuit unit 30 exhibits maximum impedance at a resonant frequency determined by the values of the artificial inductance 31 and the capacitance 32, and lesser impedances for frequencies other than the resonant frequency. The qualities (O) of the artificial inductance 31 and the capacitance 32, determine the sharpness of the frequency of maximum resonance, as is well known to those of skill in the art. The resonant circuit unit 30 contains varactor diodes and other active components (not illustrated), examples of which will be referred to hereinafter as active parallel resonant circuit units (APR).

Referring to FIG. 10, the switchably selectable filter is a narrow bandpass filter, where the resonant circuit unit 30 is identified as an active parallel resonance (APR) 30. The APR 30 is coupled in a feedback network between input and output ports of an inverting amplifier 51. A field effect transistor (FET) 48 is also connected in the feedback network between the ports of the amplifier 51, via source and drain electrodes as shown. The input port of the amplifier 51 is switchably coupled to receive signals via a FET 46. The amplifier 51 is also switchably coupled to supply signals from its output port via a FET 47. Preferably the amplifier 51 is of as high a gain and of as low a noise performance as is practically convenient in integrated circuit technology. A power supply lead V is coupled via a FET 45 with a voltage switched (VS) power feed lead. The VS power feed lead is connected to supply operating voltage to the APR 30 and the amplifier 51, and to control the conductive states of the FETs 46–48. The narrow bandpass filter is inactive and isolated unless a decoder 40 has received a predetermined code for selecting the filter. When the filter is selected the decoder 40 activates the filter into an ON state by switching voltage onto the VS power feed lead via the FET 45. Otherwise the decoder 40 maintains the bandpass filter in an OFF state, with only the decoder itself is powered. Input signals are resistively coupled to the input port via the FET 46 operating with predetermined impedance. Amplified signals are coupled from the amplifier 51 via the FET 47. The APR 30 functions as a nearly all-pass filter providing almost total negative feedback, except for a narrow frequency band of 7 or 8 MHz where little signal energy is passed. The FET 48 is either an enhancement mode, or a depletion mode device, configured to operate with predetermined impedance when voltage is supplied to its gate electrode from the VS lead. The impedance of the FET 48 determines a resistance in parallel with the APR 30, and consequently the effective gain of the amplifier 51 in the narrow frequency band of 7 or 8 Mhz. Thus, the narrow bandpass filter is arranged to have an operating bandwidth characteristic of about 10% of the frequency of one of the lower frequency channels. An example of which is in FIG. 14e.

In an integrated circuit embodiment shown in this example, only a small portion of the front-end filter in the tuner integrated circuit is active at any instant, thereby offering reduced power consumption, where the power consumption is less than that of the bulk of the integrated circuit consuming power. Furthermore, the reduced spectrum provided to the on following superheterodyne circuitry reduces filtering requirements in the on-following circuitry, making on-chip filters more practical.

In one embodiment (not illustrated) it is envisaged that an eight bit code, for selection of the desired narrowband filter, will permit the use of an individual channel filter dedicated to each channel of an extended spectrum. Where this extended spectrum includes at least all the television channels in both the cable linked service and the air linked service. Up to almost 256 different selections would be available with a few codes being reserved for other control functions. In this example, only single conversion and relatively simple filters are envisaged in the on-following superheterodyne circuitry.

Referring to FIG. 11a, the low pass circuit unit is provided by the artificial inductance 31 and the capacitance 32, where the capacitance 32 is connected between signal ground and the terminal 31b. In operation, a signal applied to the artificial inductance 31, from a signal source (not shown) at the terminal 31a, is conducted to terminal 31b via an impedance that is proportional in value to the value of the artificial inductance 31 at the signal frequency. A portion of the signal appearing at the terminal 31b is conducted with an impedance value that is in inverse proportion with respect to the value of the capacitance 32 and with respect to its signal frequency. Thus, as is well known, signal energy available to a load (not shown), connected at the terminal 31b, depends upon the source's impedance in series with the impedance of the artificial inductance 31 and the load's impedance in parallel with the impedance of the capacitance 32. In another arrangement, not shown, the capacitance 32 is connected between the terminal 31a and ground.

Referring to FIG. 11b, the high pass circuit unit is provided by the artificial inductance 31 and the capacitance 32, as shown. The capacitance 32 is connected between a signal source (not shown) having source impedance and a load (not shown) having load impedance, while the artificial inductance 31 is connected between the signal source and signal ground. A signal applied to the high pass circuit unit is conducted via the impedances of the artificial inductance 31 and the sum of the impedances of the capacitance 32 and the load. The effects of the artificial inductance 31 and the capacitance 32, with respect to signal frequencies is well known as illustrated in the preceding paragraph. Thus, signal energy available to the load depends upon the source's impedance in series the impedances of the capacitance 32, loaded by the impedance of the artificial inductance 31. In another arrangement, not shown, the artificial inductance 31 is connected between the terminal 31a and the load.

Referring to FIG. 11c, the low pass filter circuit utilizes the low pass circuit unit, illustrated in FIG. 11a, connected with input and output buffer amplifiers 33 and 34, whereby the filter characteristics are substantially constant irrespective of source and load impedances. Since the low pass filter circuit contains varactor diodes, and other active components (not illustrated), it is hereinafter referred to as an active low pass (ALP) filter. Likewise, as shown in FIG. 11d, a high pass filter circuit utilizing the high pass circuit unit illustrated in FIG. 11b is connected with input and output buffer amplifiers 33 and 34. The high pass filter circuit contains varactor diodes and other active components (not illustrated) and is hereinafter referred to as an active high pass (AHP) filter. Furthermore, each of the input and output buffer amplifiers 33 and 34, as well as the artificial inductance 31, are connected with a voltage switched (VS) power feed lead, such that when the filter is not needed for the instant operation of a tuner, it is switch OFF and thus does not contribute to power consumption.

In one example of the ALP and AHP filter circuits shown in FIGS. 11c and 11d, when the power to any one filter is switched OFF, the input buffer amplifier 33 is arranged to have an input impedance tending toward infinity, while the output buffer amplifier 34 is likewise arranged to have an output impedance tending toward infinity. In other words each filter that is switched OFF, via the VS lead, is effectively isolated from the signal path of the tuner circuit. In an array of circuits based upon filter circuits generally similar to those of FIGS. 11c and 11d, parasitic loadings of a signal source ports and output orts of switched OFF filter circuits are advantageously avoided. In one arrangement, several filters as illustrated in FIGS. 11c and 11d, are each arranged to have a uniquely different roll-off frequencies. In an example generally similar to that illustrated in FIG. 7, a parallel array of 5 such ALP filters and 5 such AHP filters covers the entire band from about 50 Mhz to about 1 Ghz, generally similar to that exemplified in FIG. 13. Another APL and HPL filter pair provides for reception of signals around about 35 Mhz, in an additional services band, shown in FIG. 13, which may include telecommunications services. One of the advantageous of this arrangement is that the structure of each filter is relatively simple and the number of filters required is relatively small, however, the on-following receiver circuitry is likely to require double frequency conversion for a preferred quality of signal. On the other hand more ALP and AHP filters with steeper roll-off characteristics in a switchable array optionally provide for finer channel selection and permit the use of on-following superheterodyne circuitry with only single frequency conversion. In one variation the bias voltages for controlling the reactances in the elements 31 and 32 are varied to narrow the passband resulting from operation of the selected ALP and AHP filter pair.

The filter illustrated in FIG. 12a is similar to the filter illustrated in FIG. 10, with the exception of the APR 30 being replaced by the ALP filter 36 and the AHP filter 38. The ALP and AHP filters 36 and 38, in this example, are arranged to have mutually exclusive passbands and roll-offs defining a mutual stopband with 6 db points at least a MHz outside of a channel width, in the negative feedback path of the filter. As in found in the filter depicted in FIG. 10, the ON impedance of the FET 48 primarily determines the attenuation, or gain, of the filter at the center of the channel frequency. Although the filter shown in FIG. 12 requires more circuit elements, and hence consumes more integrated circuit substrate area for its implementation than does the filter of FIG. 10, the roll off characteristics are thought to be more flexible and optionally designed to provide advantages.

Referring to FIG. 12b, the gate electrode of a FET 48a is shown coupled with an AGC signal. As an alternative, the FET 48 is replaced by the FET 48a depicted in FIGS. 10 and 12a, such that the passband gain in either of the filters is varied in accordance with overall gain in the signal path of the tuner.

Figure 14A:
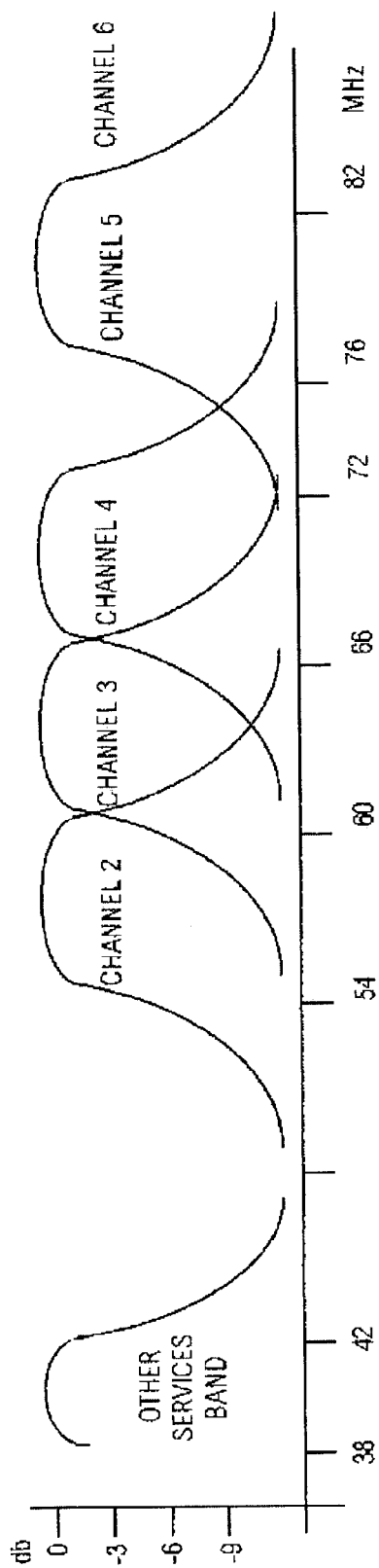
Figure 14B:
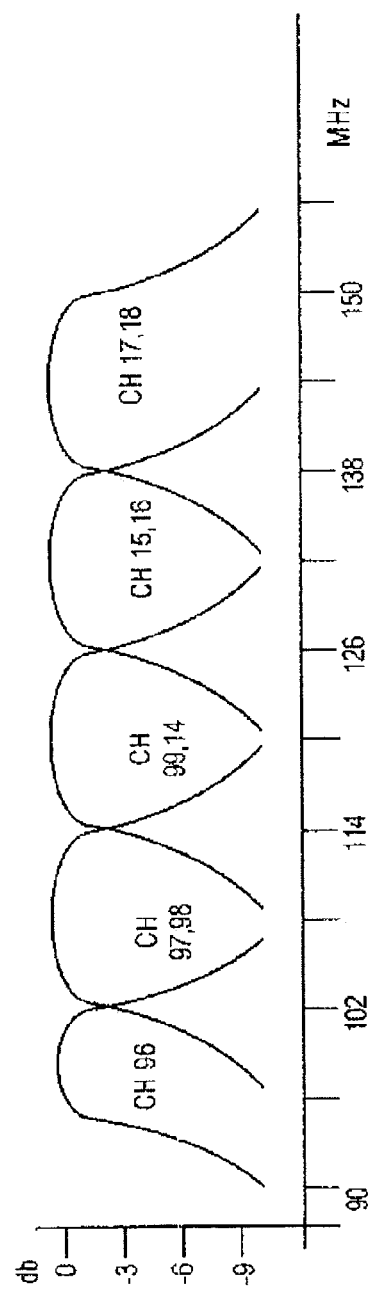
Figure 14C:
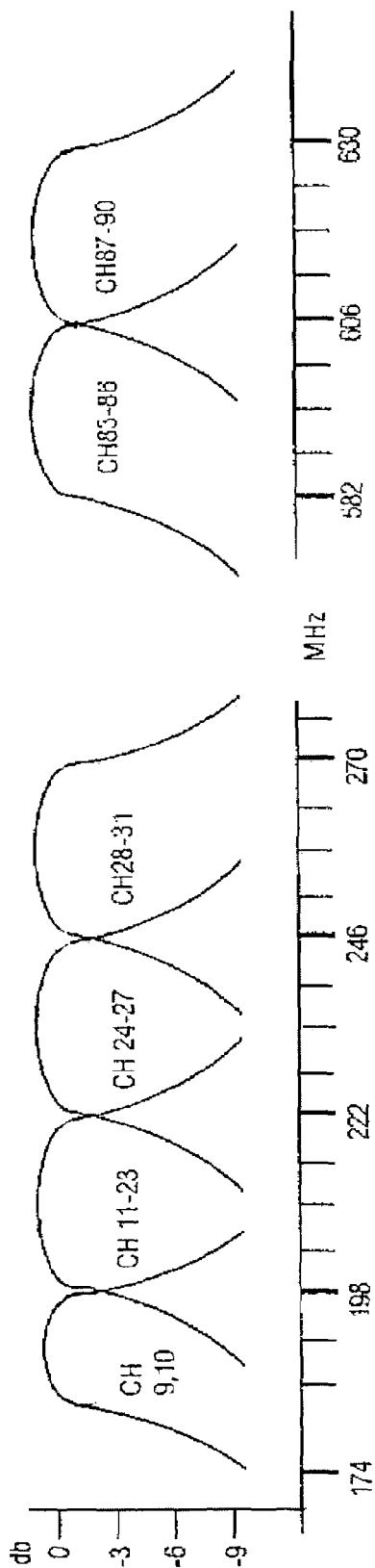
Figure 14A:
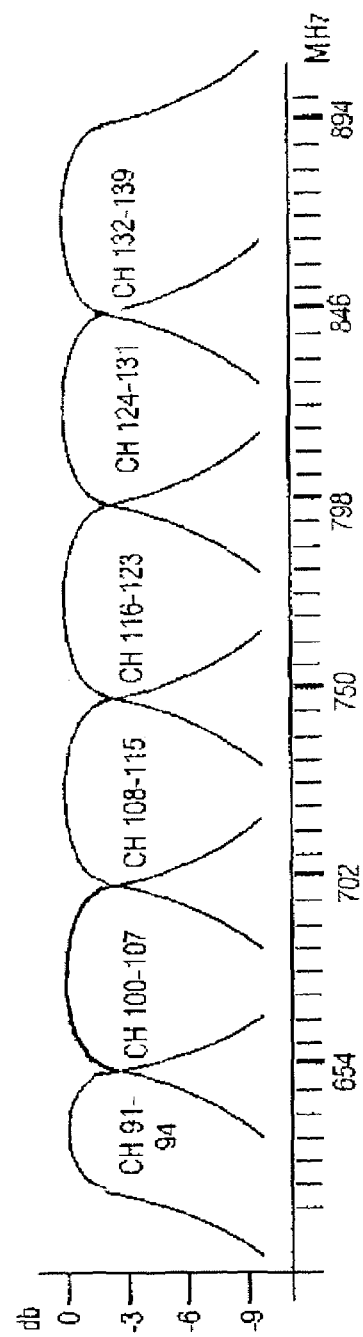

Spectral operating characteristics suitable for a filter array useful in implementing a tuner in accordance with the invention are exemplified in FIGS. 14a–14e. For example a tuner may be constructed with lower, middle, upper and high frequency filter portions using a filter array based on switchably selective filters as illustrated in FIGS. 10 and 12a. The lower frequency portion is a group of 7 single channel filters. The group of 7 single channel filters operates over a spectral portion of 54 MHz through 102 Mhz, corresponding to cable channel assignment numbers of 2 through 96. The single channel filters have ideal passband characteristics limited to about 6 Mhz, as illustrated in FIGS. 14a and 14b. As is well known, signal frequencies near the passband limits of a filter usually become shifted somewhat in phase while traversing the filter. Such phase shift is not desirable in a received TV signal, particularly near the upper frequency limit of the channel in which colour signal information resides. FIG. 14e illustrates an example of a more practical passband characteristic relative to the channels 2, 3 and 4, wherein the passband width is increased by about 1 Mhz on either side of each single channel filter to avoid significant phase shift of signal information near the limits of a received channel signal. The middle frequency filter portion is provided by a group of 8 duet channel filters. The group of duet channel filters operates over a spectral portion of 102 Mhz through 198 Mhz, corresponding to cable channel assignment numbers of 97 through 10. The duet channel filters have ideal passband characteristics as illustrated in FIGS. 14b and 14c. At the middle frequencies, the dual channel passband is more easily achievable in a practical filter. Furthermore, the upper limit of each filter passband may be extended up to about 2 Mhz or so, as compared to the passbands illustrated to avoid undue phase distortion. The upper frequency filter portion is provided by a group of 19 quartet channel filters. The group of quartet channel filters operates over a spectral portion of 198 Mhz through 654 Mhz, corresponding to cable channel assignment numbers of 11 through 94, as illustrated in FIGS. 14c and 14d. In this portion of the array the upper limit of each filter passband can be extended up to about 4 Mhz as compared to the illustrated band. The high frequency filter portion is provided by a group of 5 octet channel filters. The group of octet channel filters operates over spectral portion of 654 Mhz through 894 Mhz, corresponding to cable channel assignment numbers of 100 through 139, as illustrated in FIG. 14d. In this the highest frequency portion of the array the upper limit of each filter passband is extended up to about 8 Mhz as compared to that illustrated. As it is envisaged, the spectrum of cable services may expand to include frequencies beyond a gigahertz, where in manufacture of the tuner, the tuner is optionally provided with one or more additional octet channel filters so as to be functional across the whole spectrum when and if such extension occurs. It should be noted that the arrangement of single, duet, quartet, and octet bandwidths restrains the overall bandwidth of each filter to between about 5% and 10% of the spectrum at the frequencies of the filter operation.

Figure 15A:
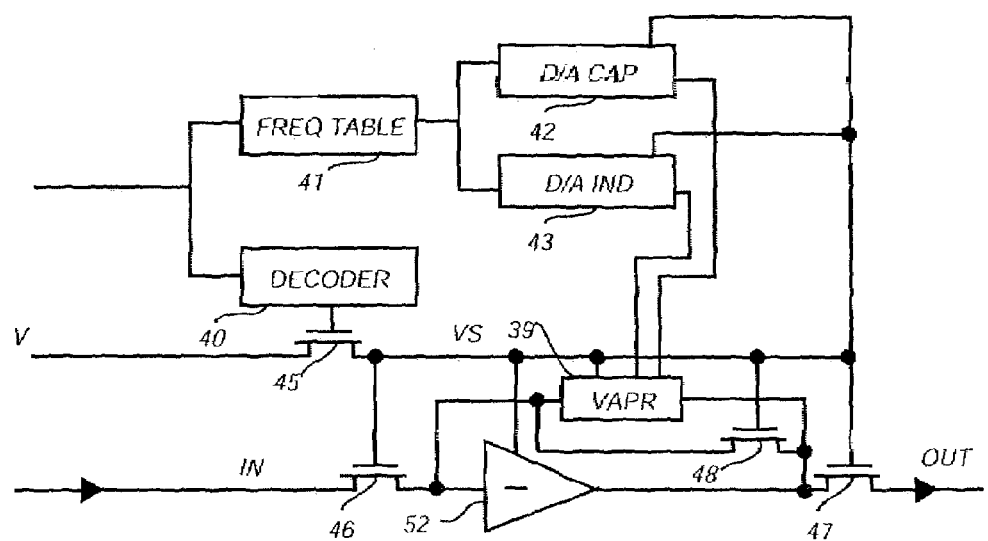
FIG. 15a illustrates a block schematic diagram of an example of a filter including an active switchably tunable parallel resonant circuit useful for providing a filter in tuners, such as those shown in any of FIGS. 4, 5 and 8.

The filter illustrated in FIG. 15a is similar to that illustrated in FIG. 10, however in this example the active parallel resonant circuit 39 is variable. Rather that being biased by fixed elements determined at the time of circuit fabrication, diode elements of the capacitance 32 and the artificial inductance 31 are biased by voltages developed in digital to analog converters labeled D/A CAP 42 and D/A IND 43, respectively. The D/A converter 42 develops a bias voltage for varactor diodes in a capacitive portion of the active parallel resonant circuit 39 and the D/A converter 43 develops a bias voltage for varactor diodes in an artificial inductance portion of the active parallel resonant circuit 39. The bias voltages are developed in response to data provided from a frequency look up table 41. In operation, the decoder is responsive to the most significant few bits of filter selection data to activate the filter elements. The bits of lesser significance are translated in the frequency table 41 and supplied as data to the D/A converters 42 and 43. For example when the filter is operating with a passband for passing channel 2 TV program signals, and a user desired to change to channel 4, for example, the D/A converters switch the filter to operating with a passband for passing channel 4 TV program signals.

In other words, when the filter is selected by data from a tuner controller either directly, or via associated circuitry in the television tuner, the filter is switched to the appropriate channel in accordance with the stored data at the storage location addressed by the selection data and operates with the desired passband. Accordingly, the tuner is tunable over a plurality of decades of the television frequency band. As it may be difficult to construct a variable filter which is entirely integrated and variable from tens of megahertz up to almost a gigahertz, several filters of appropriately different geometries are each individually selectable for receiving a corresponding portion of the band are suggested.

Figure 15B:
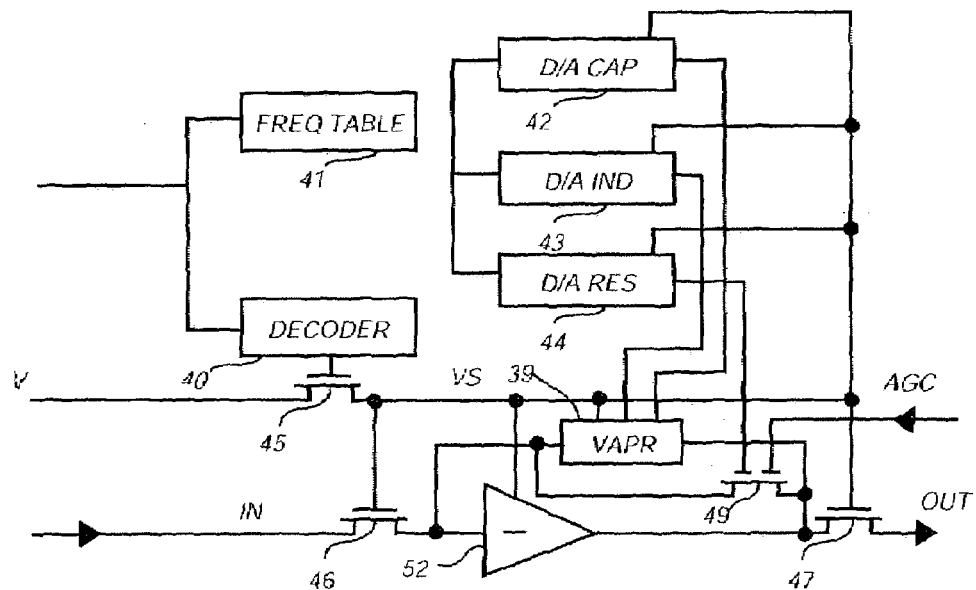
FIG. 15b illustrates a block schematic diagram of a filter similar to the filter shown FIG. 15a and including a switchable and variable gain feature.

The switchably selective filter shown in FIG. 15b is similar to the filter shown in FIG. 15a, but also includes a D/A converter 44, with an output coupled to a gate electrode of a FET 49. In this example, the FET 49 is shown to be a dual gate FET. The other of the gate electrodes is coupled with an AGC signal from on-following tuner circuitry. In operation, the gain of the filter is specified in the data of the channel selection and is further adjusted in response to the AGC signal developed in the on-following tuner circuitry to regulate the overall gain in the signal path. The passband of the filter, as depicted in either of FIGS. 15a and 15b, is controlled to switch from one channel to another channel in response to data supplied from any of the controller configurations of the various tuner and receiver examples discussed herein, particularly those shown in FIGS. 4, 5 and 8. It is the intent to further cost reduce a tuner by using only a solitary switchable filter unit somewhat similar to that illustrated in either of FIGS. 15a and 15b.

Figure 16:
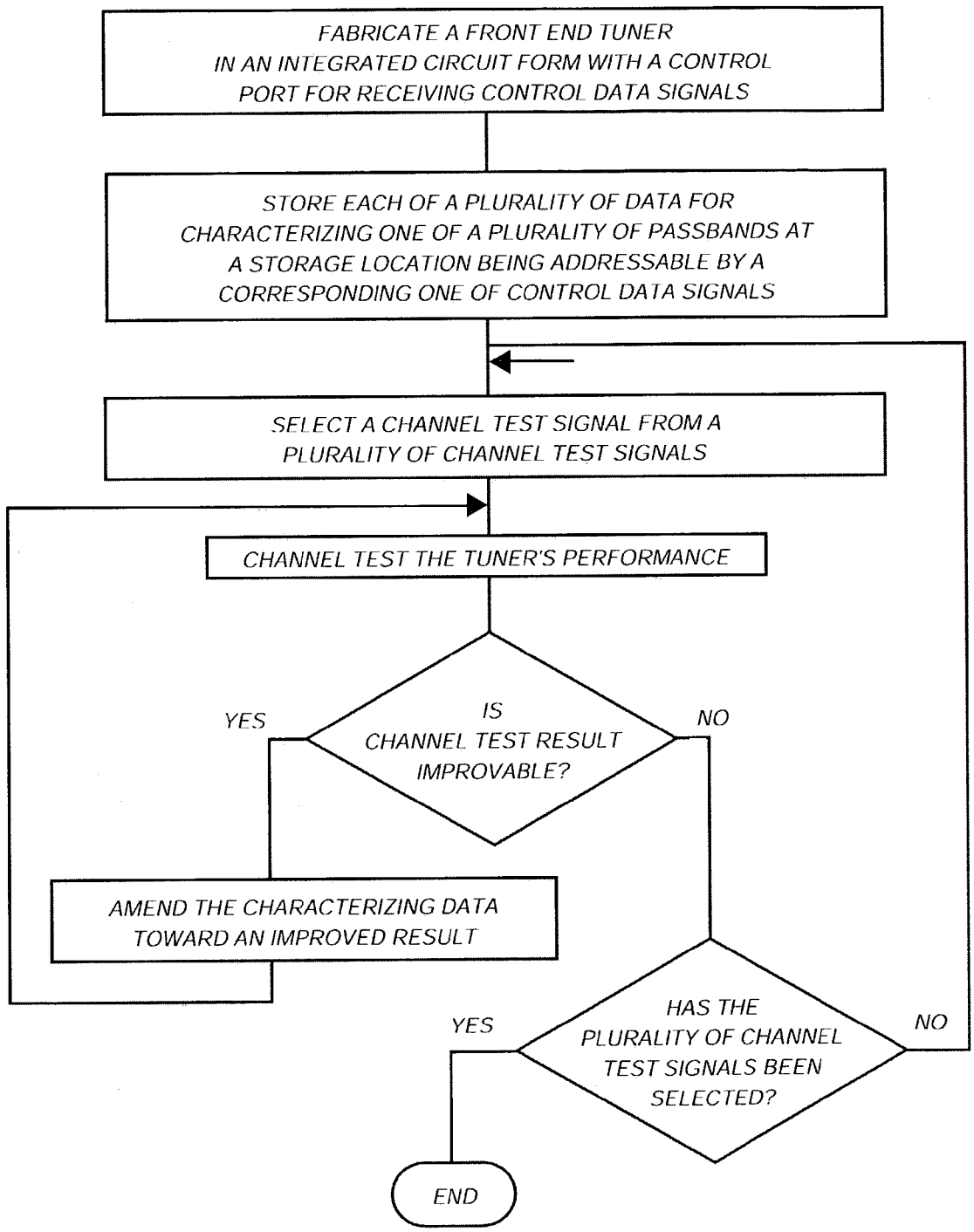
FIG. 16 illustrates a flow diagram summarily illustrating a manufacturing process, which includes programming passband characteristics in either of the filters of FIGS. 15a and 15b; and, FIG. 17 illustrates steps performed in an automated frequency control loop (AFCL) used to switchably select one of the bandpass input filters for filtering in the front end of the tuner in accordance with another embodiment of the invention.

In one example of manufacturing, the tuner utilizing filters as shown in FIG. 15a is fabricated, but before encapsulation thereof, is tested for functionality. Subsequently, the tuner is programmed appropriately for its intended use. As part of the programming process, as generally illustrated in FIG. 16, the output signal is tested with respect to an input channel standard test signal. The respective D/A converters are supplied with data being varied until a preferred, or optimal passband, performance is achieved relative to the test signal. The data specifies bias voltages are developed by the digital to analog converters 42 and 43 for tuning the variable active parallel resonant circuit unit 39. The data, which achieve the desired channel passband performances, is supplied to the frequency table 41 and stored at the address location of the channel. The process is repeated for each of the channels for which the tuner is intended to receive by applying the corresponding input channel standard test signals one after another.

In relation to a tuner utilizing a filter as illustrated in FIG. 15b, a similar process is used. The process is also used to write the gain adjusting data into the frequency table 41, for use by the D/A converter 44. In operation of the tuner circuit, switching the gain of the filter along with its channel selection and subsequently modifying the gain responsive to the AGC signal permits a degree of flexibility to further reduce the requirements of the on-following integrated tuner circuitry.

It is envisaged that precision and consistency in integrated circuit manufacture optionally eliminates programming requirements of the tuner, whereby the frequency table 41 is optionally permanently constructed with standard predetermined data during manufacture.

Figure 17:
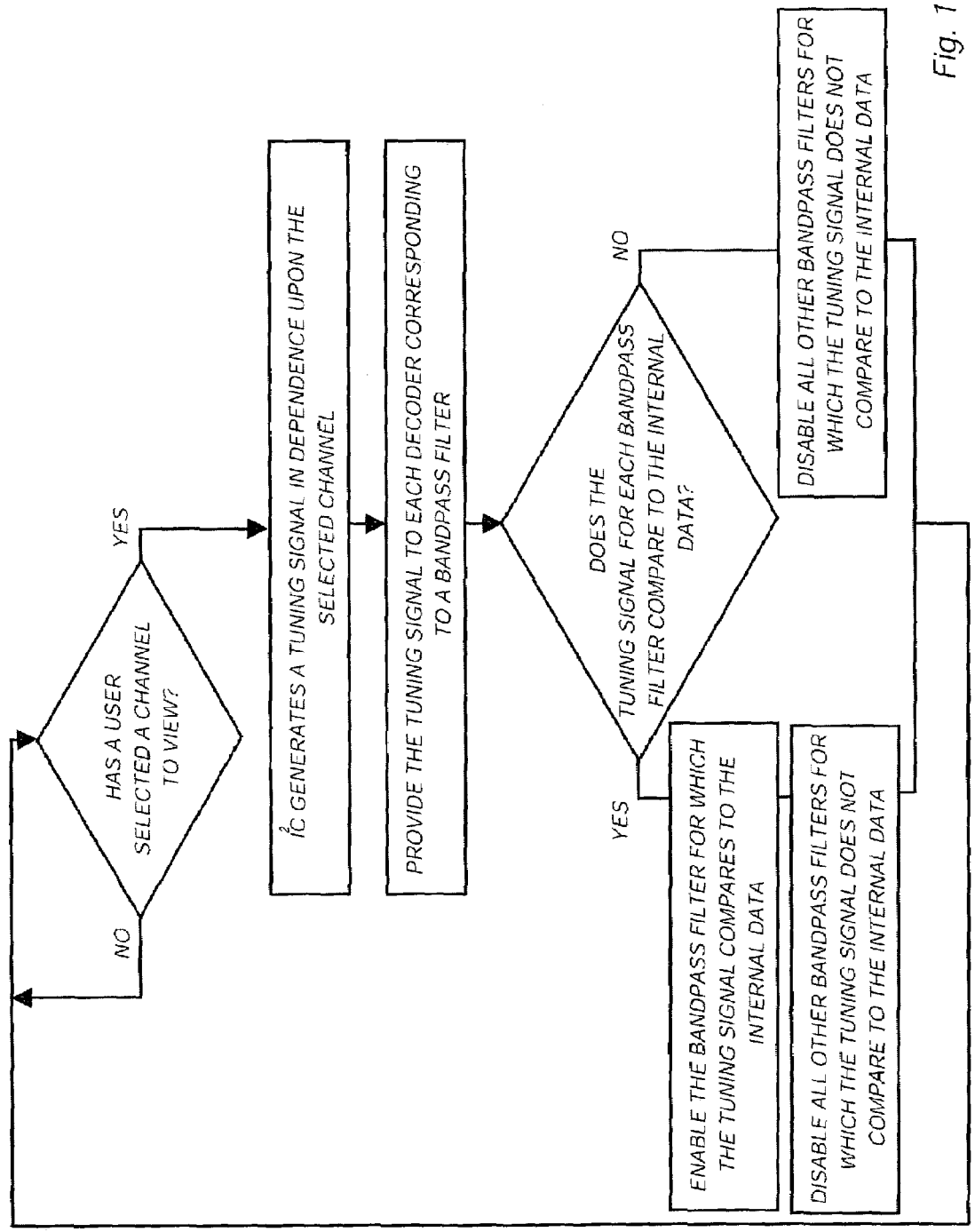

FIG. 17 illustrates steps performed in an automated frequency control loop (AFCL) used to switchably select one of the bandpass input filters (301a through 301n) for filtering in the front end of the tuner 300. Upon the user having selected a channel to view, the IC2 1108 generates a tuning signal. Each decoder corresponding to each bandpass filter 301a through 301n compares the tuning signal to internal data. If for a given bandpass filter the tuning signal is in accordance with its internal data, then that bandpass filter is enabled by the decoder and all other bandpass filters are disabled by their respective decoders. Once the channel has been changed, the AFCL process repeats in determining whether a channel change has been performed and whether to enable another bandpass filter from within the array. Of course, if each bandpass filter is set to filter more than one channel, then potentially the same bandpass is used for the new channel selection if the selected channel lies within the same enabled filter passband.

Of course, the tuning signal is optionally an analog signal or a digital signal. If the tuning signal is an analog signal then the internal data within each filter decoder corresponds to voltage data. Thus, within the decoder a comparator circuit is provided to compare the tuning signal to the internal voltage data to determine whether this voltage data is within the range for operation of the given filter. If it is, then that bandpass filter is enabled, otherwise once this tuning signal is out of the voltage range for the given filter then that filter is disabled. On the other hand, if the tuning signal is a digital signal then the internal data for each filter is a digital value, where this digital value is compared to the digital tuning signal to determine whether to enable the given bandpass filter or whether to disable the given bandpass filter. Of course, when a given bandpass filter is enabled from the array, all other bandpass filters are preferably disabled. Preferably, the AFCL is implemented within software stored in a memory circuit within the I2C interface 1108.

Advantageously for reduced tuner 300 power consumption, only a small portion of the front-end filters 301 in the tuner 300 are active at any instant, thereby offering reduced power consumption, where the power consumption is less than that of the power consumption of the bulk of the integrated circuit.

Numerous other embodiments maybe envisioned without departing from the spirit or scope of the invention.

What is claimed is:

1. A tuner for receiving information signals within a channel selected from within a plurality of channels and being within a predesignated frequency band, the tuner comprising:

a first filter for providing a plurality of passbands each being exclusively selectable in response to a filter selection signal designating a corresponding one of the plurality of passbands, each of said passbands being characterized by a bandwidth being sufficiently broad to admit signals in at least one of the plurality of channels with lesser attenuation than other signals;

an input port for receiving information signals and conducting the received information signals to the filter;

an output port for conducting any signals having been admitted by the first filter;

superheterodyne circuitry including a mixer and a second filter for processing any signals coupled thereto via the output port and discriminating the received information signals within the selected channel; wherein, at least one of the first and second filters is a pass band filter integrated within a semiconductor substrate and comprising:
a filter selection signal port for receiving a filter selection signal;
a frequency data table for converting the filter selection signal to corresponding bias data signals; and,
a capacitance D/A bias converter and an inductance D/A bias converter, being coupled to a variable capacitance and an active inductance respectively and being responsive respective ones of the bias data signals for adjusting the effective values of the reactance elements to effect a passband filter function as designated by the filter selection signal.

2. A tuner as defined in claim 1 wherein the other of the first and second filters is integrated within the semiconductor substrate and comprises:
a switching filter selection signal port for receiving a switching filter selection signal; and,
a plurality of bandpass filters each including a switch controlled by data representing the switching filter selection signal for exclusively activating the bandpass filter.

3. A tuner as defined in claim 1 wherein the other of the first and second filters is integrated within the semiconductor substrate and comprises:
a plurality of lowpass and highpass filters, each comprising:
a passband filter selection signal port for receiving a passband filter selection signal; and,
a switch responsive to data representing the passband filter selection signal, whereby ones of said highpass and lowpass filters are activatable in pairs.

4. A tuner as defined in claim 1 further comprising:
a signal processor for providing a composite video signal and for providing tuning error signal representing a tuning error in response to received information signals from the superheterodyne circuitry; and,
a synthesizer for providing at least one local oscillator signal for operation of the superheterodyne circuitry, the local oscillator signal being of a frequency substantially corresponding to a predetermined frequency for discriminating signals within the selected channel, and being responsive to a tuning error signal for adjusting the frequency of the local oscillator signal toward eliminating the tuning error.

5. A tuner as defined in claim 1 wherein the other of the first and second filters is a second pass band filter integrated within the semiconductor substrate and comprising:
a second filter selection signal port for receiving a second filter selection signal;
a second frequency data table for converting the second filter selection signal to corresponding second bias data signals; and,
a second capacitance D/A bias converter and an second inductance D/A bias converter, being coupled to the second variable capacitance and the second active inductance respectively and being responsive respective ones of the second bias data signals for adjusting the effective values of the reactance elements to effect a second passband filter function as designated by the second filter selection signal.

6. A tuner as defined in claim 1 wherein at least one of the filters comprises: active and passive elements including an active inductance being integrated within a semiconductor substrate.

7. A tuner for receiving information signals within a channel selected from within a plurality of channels and being within a predesignated frequency band, the tuner comprising:
a first filter for providing a plurality of passbands each being exclusively selectable in response to a filter selection signal designating a corresponding one of the plurality of passbands, each of said passbands being characterized by a bandwidth being sufficiently broad to admit signals in at least one of the plurality of channels with lesser attenuation than other signals;
an input port for receiving information signals and conducting the received information signals to the filter;
an output port for conducting any signals having been admitted by the first filter;
superheterodyne circuitry including a mixer and a second filter for processing any signals coupled thereto via the output port and discriminating the received information signals within the selected channel; wherein,
at least one of the first and second filters comprises:
a filter selection signal port for receiving a filter selection signal; and,
a plurality of bandpass filters each including a decoder being responsive to the filter selection signal designating a corresponding one of the plurality of passbands for asserting a switch ON signal and a switch for activating the bandpass filter in response to the switch ON signal from the decoder and otherwise maintaining the bandpass filter in an OFF state.

8. A tuner for receiving information signals within a channel selected from within a plurality of channels and being within a predesignated frequency band, the tuner comprising:
a first filter for providing a plurality of passbands each being exclusively selectable in response to a filter selection signal designating a corresponding one of the plurality of passbands, each of said passbands being characterized by a bandwidth being sufficiently broad to admit signals in at least one of the plurality of channels with lesser attenuation than other signals;
an input port for receiving information signals and conducting the received information signals to the filter;
an output port for conducting any signals having been admitted by the first filter; superheterodyne circuitry including a mixer and a second filter for processing any signals coupled thereto via the output port and discriminating the received information signals within the selected channel; wherein
at least one of the first and second filters is integrated within a semiconductor substrate and comprises:
a plurality of bandpass filters, each comprising:
a filter selection signal port for receiving a filter selection signal; and,
a switch and a digital to analog converter, the switch being responsive to data representing the filter selection signal for activating the bandpass filter and the digital to analog converter and the activated digital to analog converter being responsive to said data for generating a bias voltage for selecting a passband of operation in the activated bandpass filter.

9. A tuner as defined in claim 8 wherein each of the bandpass filters further comprises:
a frequency table for converting a data representing the filter selection signal to a passband selection signal for use by the digital to analog converter, whereby a selected filter is switchable to any of a plurality of predesignated passbands.

10. An integrated circuit tuner, responsive to a tuner controller signal, for receiving information modulated signals from a designated one of a multitude of channels in a predesignated band of frequencies, comprising:
- at least several switchable bandpass filters each being selectable for admitting signals in at least one of several channels in adjacent frequency bands in response to the control signal;
- an input port for receiving signals and conducting the received signals to said at least several bandpass filters;
- an output port for coupling any signals having been admitted via any of said at least several bandpass filters;
- a superheterodyne circuit for discriminating the received information signals within the selected channel; and,
- a tuner controller port for receiving the tuner controller signal;
- said at least several bandpass filters each having a pass band characteristic being defined by a mutually exclusive central frequency and a bandwidth sufficiently broad to admit at least one of said channels with a substantially flat gain there being sufficient bandpass filters within said at least several bandpass filters to admit information signals within any designated channel;
- said at least several bandpass filters each including a switch for enabling the bandpass filter with energizing power, the switch being responsive to the tuner controller signal; and
- at least one of the several bandpass filters is integrated within a semiconductor substrate and comprises:
- a bandpass filter selection signal port for receiving a bandpass filter selection signal;
- a frequency data table for converting the filter selection signal to corresponding bias data signals; and,
- a capacitance D/A bias converter and an inductance D/A bias converter, being coupled to a variable capacitance and an active inductance respectively and being responsive respective ones of the bias data signals for adjusting the effective values of the reactance elements to effect a passband filter function as designated by the bandpass filter selection signal.

11. An integrated circuit tuner as defined in claim 10 wherein the bandpass characteristic of each of the several bandpass filters are defined by a parallel resonant active circuit in a feedback path in combination with an inverting amplifier.

12. An integrated circuit tuner as defined in claim 10 wherein the pass band characteristic of each of the several bandpass filters is between about 5% and 10% of a central frequency of the respective passband.

13. An integrated circuit tuner as defined in claim 10 wherein the pass band characteristics are defined by lowpass and highpass filter circuits being switchably selectable in pairs.

14. An integrated circuit tuner as defined in claim 13 wherein the pass band characteristic of each of the selectable in pairs is about one octave in the predesignated band of frequencies.

15. A television signal receiving appliance for receiving TV program information signals within a channel selected via a tuner controller, the receiving appliance comprising:
- an input port for receiving TV program information signals;
- a filter selection signal port for receiving a filter selection signal;
- a tuner including a first filter for providing a plurality of passbands each being exclusively selectable in response to the filter selection signal designating a corresponding one of the plurality of passbands, each of said passbands being characterized by a bandwidth being sufficiently broad to admit signals in at least one of the plurality of channels with lesser attenuation than other signals in response to an activating control signal from the tuner controller, the tuner also including superheterodyne circuitry with a mixer and a second filter for discriminating the received information signals within the selected channel; and,
- detection and processing circuitry being responsive to the discriminated signals for generating a video signal and an audio signal; and at least one of
- an apparatus for visual display and sound reproduction of the video and audio signals and a recording apparatus for storing at least one of the video and audio signals as it occurs over a period of time, for future use
- wherein at least one of the first and second filters includes a tunable filter element, the tunable filter element comprising:
- a variable parallel resonant circuit with a bias voltage responsive capacitance element and a bias voltage responsive active inductance element,
- an inverting amplifier with a feedback loop including the variable parallel resonant circuit; and,
- respective digital to analog converters each being responsive to reproduced data for generating said bias voltages.

16. A television signal receiving appliance as defined in claim 15 wherein each of said passbands is further characterized by a bandwidth being sufficiently narrow to admit signals in a minority of channels of adjacent channel frequencies in the plurality of channels with lesser attenuation than other signals.

17. A television signal receiving appliance as defined in claim 15 wherein the tuner is an integrated circuit.

18. A television signal receiving appliance as defined in claim 15 wherein the tuner and the detection and processing circuitry are integrated within a semiconductor substrate.

19. A television signal receiving appliance as defined in claim 15 further comprising:
- a tuner controller port for receiving a control data signal; and,
- a memory for storing channel selection data, wherein the first filter is provided by a plurality of data corresponding to the selectable channels in combination with the tunable filter element, each data from the plurality being stored at a predetermined location within the memory and reproduced in response to a corresponding control data signal, each data characterizing one of a plurality of passbands each of a bandwidth being sufficiently broad to admit at least one of the plurality of channels in the received information signal with lesser attenuation than others of the plurality of channels, the tunable filter element being switchable from one passband to another in response to the control data signal.

20. An integrated front end filter in a tuner, comprising:
- a tuner controller port for receiving a control data signal from a tuner controller; and,
- a memory for storing a plurality of data corresponding to the selectable channels in combination with a tunable filter element, each data being stored at predetermined location within the memory and reproduced in response to the corresponding control data signal from a tuner controller, each data characterizing one of a plurality of passbands each of a bandwidth being sufficiently broad to admit at least one of the plurality of channels in the received information signal with lesser attenuation than others of the plurality of channels, the tunable filter element being switchable from one passband to another in response to the control data signal; wherein, the tunable filter element comprises:
- a variable parallel resonant circuit with a bias voltage responsive capacitance element and a bias voltage responsive active inductance element;
- an inverting amplifier with a feedback loop including the variable parallel resonant circuit; and,
- respective digital to analog converters each being responsive to reproduced data for generating said bias voltages.

21. An integrated front-end filter in a tuner according to claim 20 wherein the front-end filter comprises;
- at least the front end filter in an integrated circuit form;
- an electronic memory; the electronic memory for storing each of the plurality of data at a storage location being addressable by a corresponding one of the control data signals, such that in subsequent use, the tunable filter element is switchable from one passband to another in response to the control data signal.

22. An integrated front-end filter in a tuner according to claim 21 wherein the storing of each of the plurality of data comprises
- channel testing the tuner's performance by operating the tuner with a channel test signal selected from a plurality of channel test signals; and,
- if a result of the channel test is less than a predetermined standard, amending the data characterizing the passband to urge the result toward the predetermined standard; and otherwise,
- repeating the channel testing step with each channel test signal until each of the channel test signals has been selected.

23. A method of receiving RF information modulated signals from a designated one of a multitude of channels in a predesignated band of frequencies, comprising the steps of:
- providing a plurality of switchably selectable bandpass filters each being selectable for admitting signals in at least one of several channels in adjacent frequency bands;
- determining a desired channel from the multitude of channels;
- generating a tuning signal in dependence upon the determined channel;
- receiving the tuning signal by the plurality switchably selectable bandpass filters;
- comparing the tuning signal to predetermined data within the plurality switchably selectable bandpass filters;
- enabling a single switchably selectable bandpass filter from the plurality of switchably selectable bandpass filters for which the tuning signal compares to the predetermined data; and,
- disabling the plurality of switchably selectable bandpass filters that are other than the single enabled switchably selectable bandpass filter; wherein,
- providing at least one of the plurality of switchably selectable bandpass filters is by providing a pass band filter integrated within a semiconductor substrate; the pass band filter comprising:
- a filter selection signal port for receiving a filter selection signal;
- a frequency data table for converting the filter selection signal to corresponding bias data signals; and,
- a capacitance D/A bias converter and an inductance D/A bias converter, being coupled to a variable capacitance and an active inductance respectively and being responsive respective ones of the bias data signals for adjusting the effective values of the reactance elements to effect a passband filter function as designated by the filter selection signal.

24. A method according to claim 23 wherein the tuning signal is an analog tuning signal.

25. A method according to claim 24 wherein the predetermined data comprises analog voltage data.

26. A method according to claim 25 further comprising the step of:
- providing a comparator circuit for performing the step of comparing the analog tuning signal to the analog voltage data.

27. A method according to claim 23 wherein the tuning signal is a digital tuning signal.

28. A method according to claim 27 wherein the predetermined data comprises digital data.

29. A method according to claim 23 wherein the enabled single switchably selectable bandpass filter comprises the desired channel within the at least one of several channels in adjacent frequency bands.

30. A method according to claim 23 further comprising;
- providing a memory circuit having an output port coupled to each switch port from a plurality of switchably selectable bandpass filters each being selectable for admitting signals in at least one of several channels in adjacent frequency bands, the memory circuit having instructions contained therein for performing the steps of:
- determining a desired channel having information modulated signals therein from a multitude of channels each having information modulated signals therein;
- generating a tuning voltage in dependence upon the determined channel; and, providing a tuning voltage to the output port coupled to the each switch port of the plurality switchably selectable bandpass filters.

* * * * *